US010564550B2

(12) United States Patent
Miyake et al.

(10) Patent No.: US 10,564,550 B2
(45) Date of Patent: Feb. 18, 2020

(54) ILLUMINATION OPTICAL ASSEMBLY, EXPOSURE DEVICE, AND DEVICE MANUFACTURING METHOD

(71) Applicant: NIKON CORPORATION, Tokyo (JP)

(72) Inventors: Norio Miyake, Tokyo (JP); Kinya Kato, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/244,362

(22) Filed: Jan. 10, 2019

(65) Prior Publication Data

US 2019/0163068 A1 May 30, 2019

Related U.S. Application Data

(60) Continuation of application No. 15/378,582, filed on Dec. 14, 2016, now Pat. No. 10,353,294, which is a (Continued)

(51) Int. Cl.

*G03F 7/20* (2006.01)
*G02B 5/30* (2006.01)

(Continued)

(52) U.S. Cl.

CPC ......... *G03F 7/7015* (2013.01); *G02B 5/3083* (2013.01); *G02B 26/0816* (2013.01);

(Continued)

(58) Field of Classification Search

CPC .... G03F 7/20; G03F 7/70075; G03F 7/70116; G03F 7/70566; G02B 26/0816;

(Continued)

(56) References Cited

U.S. PATENT DOCUMENTS 5,312,513 A 5/1994 Florence et al.
5,867,302 A 2/1999 Fleming (Continued)

FOREIGN PATENT DOCUMENTS

EP 3 779 530 A1 6/1997
EP 1 420 298 A2 5/2004

(Continued)

OTHER PUBLICATIONS

Jan. 21, 2019 Office Action issued in Korean Application No. 10-2019-7000855.

(Continued)

*Primary Examiner* — Deoram Persaud
(74) *Attorney, Agent, or Firm* — Oliff PLC

(57) ABSTRACT

An illumination optical system includes a first spatial light modulator having a plurality of optical elements into which the light from the light source comes, a polarizing member having a first polarizing element into which a first light of a light from the first spatial light modulator comes and a second polarizing element into which a second light of the light from the first spatial light modulator comes, so as to allow the first light traveled via the first polarizing element and the second light traveled via the second polarizing element to have polarizing states different from each other, the first and second lights traveling through positions relative to an optical axis of the illumination optical system different from each other, and a second spatial light modulator having a plurality of optical elements into which the first and second lights from the polarizing member come.

15 Claims, 19 Drawing Sheets

5A
52d
52a
52h
52g
AX
52e
52f
52c
52b
z
x

Related U.S. Application Data division of application No. 14/126,126, filed as application No. PCT/JP2011/077199 on Nov. 25, 2011, now Pat. No. 9,523,918, which is a continuation of application No. 61/496,234, filed on Jun. 13, 2011.

(51) Int. Cl.
*G02B 26/08* (2006.01)
*G02B 27/09* (2006.01)
*G02B 27/28* (2006.01)

(52) U.S. Cl.
CPC ....... *G02B 27/0927* (2013.01); *G02B 27/286* (2013.01); *G03F 7/20* (2013.01); *G03F 7/70075* (2013.01); *G03F 7/70116* (2013.01); *G03F 7/70566* (2013.01)

(58) Field of Classification Search
CPC ......................... G02B 27/0927; G02B 27/286; G02B 5/3083; H01L 21/027
See application file for complete search history.

(56) References Cited

U.S. PATENT DOCUMENTS

| | | | |
|---|---|---|---|
| 6,480,320 | B2 | 11/2002 | Nasiri |
| 6,600,591 | B2 | 7/2003 | Anderson et al. |
| 6,611,316 | B2 | 8/2003 | Sewell |
| 6,733,144 | B2 | 5/2004 | Kwon |
| 6,885,493 | B2 | 4/2005 | Ljungblad et al. |
| 6,891,655 | B2 | 5/2005 | Grebinski et al. |
| 6,900,915 | B2 | 5/2005 | Nanjyo et al. |
| 6,913,373 | B2 | 7/2005 | Tanaka et al. |
| 6,952,253 | B2 | 10/2005 | Lof et al. |
| 7,023,610 | B2 | 4/2006 | Ohtsuki et al. |
| 7,095,546 | B2 | 8/2006 | Mala et al. |
| 7,295,726 | B1 | 11/2007 | Milanovic et al. |
| 7,424,330 | B2 | 9/2008 | Duerr et al. |
| 7,567,375 | B2 | 7/2009 | Enoksson et al. |
| 2005/0095749 | A1 | 5/2005 | Krellmann et al. |
| 2007/0146676 | A1 | 6/2007 | Tanitsu et al. |
| 2007/0188730 | A1 | 8/2007 | Takeuchi et al. |
| 2007/0296936 | A1 | 12/2007 | Kato et al. |
| 2008/0030707 | A1 | 2/2008 | Tanaka et al. |
| 2008/0309901 | A1 | 12/2008 | Soemers et al. |
| 2009/0091730 | A1 | 4/2009 | Tanaka |
| 2009/0109417 | A1 | 4/2009 | Tanitsu |
| 2009/0117494 | A1 | 5/2009 | Owa |
| 2009/0128886 | A1 | 5/2009 | Hirota |
| 2009/0135392 | A1 | 5/2009 | Muramatsu |
| 2010/0020302 | A1 | 1/2010 | Freimann |
| 2010/0149504 | A1* | 6/2010 | Deguenther ........ G03F 7/70116 355/66 |
| 2010/0165318 | A1 | 7/2010 | Fiolka et al. |
| 2011/0037962 | A1 | 2/2011 | Tanitsu |
| 2012/0249989 | A1 | 10/2012 | Fujii |
| 2013/0077077 | A1 | 3/2013 | Saenger et al. |
| 2013/0148359 | A1 | 6/2013 | Smith et al. |
| 2013/0314683 | A1 | 11/2013 | Watanabe et al. |
| 2014/0233008 | A1 | 8/2014 | Tanitsu et al. |
| 2014/0293254 | A1 | 10/2014 | Komatsuda |
| 2015/0077732 | A1 | 3/2015 | Owa et al. |

FOREIGN PATENT DOCUMENTS

| | | | |
|---|---|---|---|
| JP | H06-124873 | A | 5/1994 |
| JP | H10-303114 | A | 11/1998 |
| JP | 3246615 | B2 | 1/2002 |
| JP | 2006-113437 | A | 4/2006 |
| KR | 10-2013-0041833 | A | 4/2013 |
| WO | 99/49504 | A1 | 9/1999 |
| WO | 01/35168 | A1 | 5/2001 |
| WO | 2004/055803 | A1 | 7/2004 |
| WO | 2010/037476 | A2 | 4/2010 |
| WO | 2010/040506 | A1 | 4/2010 |
| WO | 2011/147658 | A1 | 12/2011 |

OTHER PUBLICATIONS

Jan. 22, 2015 Extended Search Report issued in European Application No. 11867928.1.

Jul. 30, 2015 Office Action issued in Japanese Application No. 2013-520404.

Apr. 11, 2016 Office Action issued in U.S. Appl. No. 14/126,126.

Sep. 11, 2015 Office Action issued in U.S. Appl. No. 14/126,126.

Aug. 16, 2016 Notice of Allowance issued in U.S. Appl. No. 14/126,126.

Dec. 20, 2011 International Search Report issued in International Application No. PCT/JP2011/077199.

Dec. 20, 2011 Written Opinion issued in International Application No. PCT/JP2011/077199.

Jan. 10, 2018 Office Action issued in U.S. Appl. No. 15/378,582.

Jan. 3, 2018 Office Action issued in European Application No. 11867928.1.

Dec. 18, 2017 Office Action issued in Korean Application No. 10-2014-7000711.

May 29, 2018 Office Action issued in Japanese Application No. 2017-125694.

Oct. 12, 2018 Notice of Allowance issued in U.S. Appl. No. 15/378,582.

Sep. 4, 2019 Extended European Search Report issued in European Patent Application No. 19 16 3401.3.

Feb. 15, 2019 Decision of Refusal issued in Japanese Application No. 2017-125694.

* cited by examiner

A-A CROSS SECTION

B-B CROSS SECTION

ILLUMINATION OPTICAL ASSEMBLY, EXPOSURE DEVICE, AND DEVICE MANUFACTURING METHOD

This is a continuation of U.S. patent application Ser. No. 15/378,582 filed Dec. 14, 2016, which in turn is a divisional of U.S. patent application Ser. No. 14/126,126 (now U.S. Pat. No. 9,523,918), which is a U.S. national phase of International Application No. PCT/JP2011/077199 filed on Nov. 25, 2011 claiming the conventional priority of U.S. Provisional Patent Application No. 61/496,234, filed Jun. 13, 2011. The disclosure of each of the prior applications is incorporated herein by reference in their entirety.

TECHNICAL FIELD

The present teaching relates to an illumination optical system, an exposure apparatus, and a method for producing a device.

BACKGROUND ART

In a typical exposure apparatus of this type, the light, which is radiated from a light source, forms, via a fly's-eye lens as an optical integrator, a secondary light source as a substantial surface light source composed of a large number of light sources (in general, a predetermined light intensity distribution on an illumination pupil). In the following description, the light intensity distribution, which is provided on the illumination pupil, is referred to as "pupil intensity distribution". Further, the illumination pupil is defined as the position which makes the illumination objective surface (plane) the Fourier transform plane of the illumination pupil by the aid of the action of the optical system disposed between the illumination pupil and the illumination objective surface (plane) (mask or wafer in the case of the exposure apparatus).

The light, which comes from the secondary light source, is collected by a condenser optical system, and then illuminates a mask, on which a predetermined pattern is formed, in a superimposed (overlaid) manner. The light, which is transmitted through the mask, forms an image on a wafer via a projection optical system, and the mask pattern is projected and exposed (transferred) onto the wafer. The pattern, which is formed on the mask, is fine and minute. In order to correctly transfer the fine pattern onto the wafer, it is indispensable to obtain a uniform illuminance distribution on the wafer.

Conventionally, it has been suggested a technique in which an annular (circular zonal) or multi-pole-shaped secondary light source (pupil intensity distribution) is formed on an illumination pupil defined on a back focal plane of a fly's-eye lens or in the vicinity thereof by the action of an aperture diaphragm which is equipped with a wavelength plate and which is arranged just downstream from the fly's-eye lens, and the setting is made such that the light beam (luminous flux), which passes through the secondary light source, is in a linear polarization state in which the circumferential direction is the polarization direction (hereinafter abbreviated and referred to as "circumferential direction (azimuthal direction) polarization state") (see, for example, Japanese Patent No. 3246615).

SUMMARY

In order to realize the illumination condition suitable to faithfully transfer fine patterns having various forms, it is desired to improve the degree of freedom in the change of the shape (broad concept including the size) of the pupil intensity distribution and the change of the polarization state. However, in the case of the conventional technique described in Patent Document 1, it has been impossible to change the shape of the pupil intensity distribution and the polarization state except if the aperture diaphragm equipped with the wavelength plate is exchanged.

The present teaching has been made taking the foregoing problem into consideration, an object of which is to provide an illumination optical system having a high degree of freedom in the change of the polarization state. Another object of the present teaching is to provide an exposure apparatus and a method for producing a device which make it possible to correctly transfer a fine pattern to a photosensitive substrate under an adequate illumination condition by using the illumination optical system having the high degree of freedom in the change of the polarization state.

According to a first aspect, there is provided an illumination optical system for illuminating an illumination objective surface with light from a light source, the illumination optical system including, a first spatial light modulator which has a plurality of optical elements arranged on a first plane and controlled individually; a polarizing member which is arranged in an optical path on an illumination objective surface side with respect to the first plane and which gives a change of a polarization state to a first light beam passing through a first area in a plane intersecting an optical axis of the illumination optical system, the change of the polarization state being different from a change of the polarization state given to a second light beam passing through a second area in the intersecting plane, the second area being different from the first area; and a second spatial light modulator which has a plurality of optical elements controlled individually and arranged on a second plane in the optical path on the illumination objective surface side with respect to the first plane or in an optical path on a light source side with respect to the first plane, and which variably forms a light intensity distribution on an illumination pupil of the illumination optical system.

According to a second aspect, there is provided an exposure apparatus including the illumination optical system of the first aspect for illuminating a predetermined pattern, wherein a photosensitive substrate is exposed with the predetermined pattern.

According to a third aspect, there is provided a method for producing a device, including, exposing the photosensitive substrate with a predetermined pattern by using the exposure apparatus of the second aspect, developing the photosensitive substrate to which the predetermined pattern is transferred so that a mask layer, which has a shape corresponding to the predetermined pattern, is formed on a surface of the photosensitive substrate; and processing the surface of the photosensitive substrate via the mask layer.

BRIEF DESCRIPTION OF THE DRAWINGS

FIG. 19 shows a flow chart illustrating steps of producing a liquid crystal device such as a liquid crystal display element or the like.

DESCRIPTION OF THE EMBODIMENTS

Figure 1:
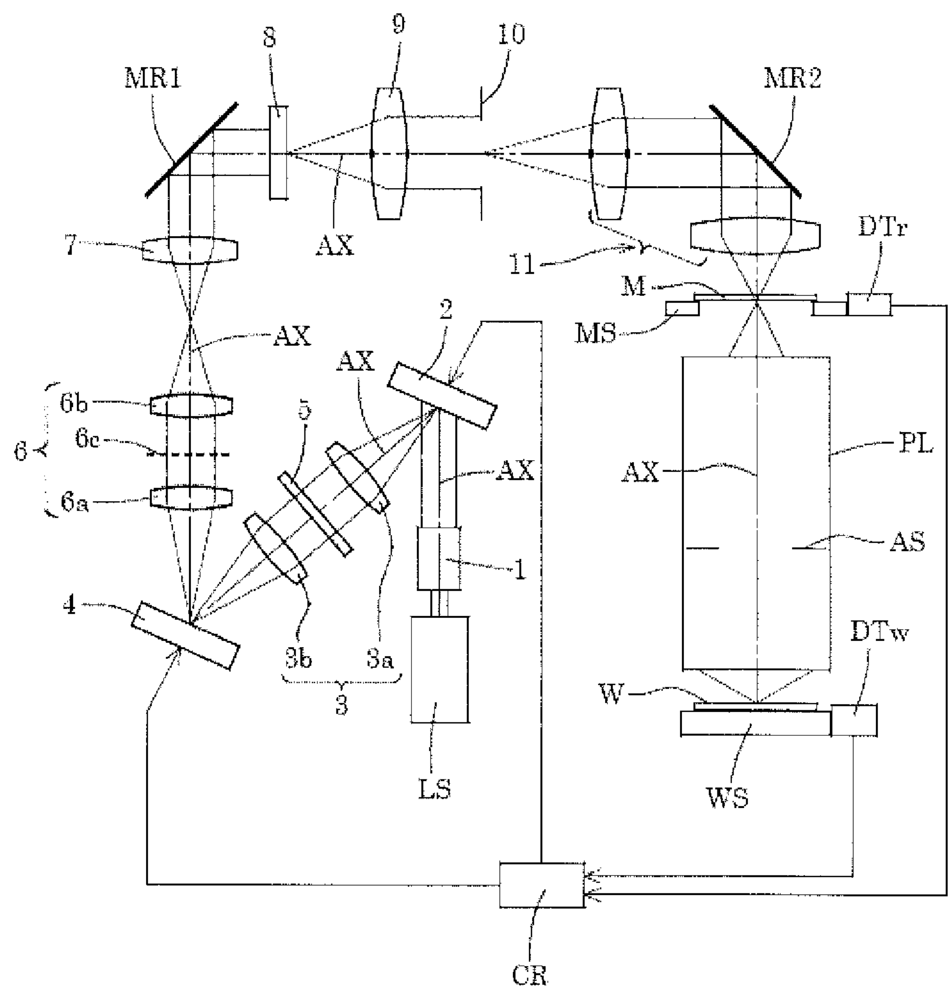
FIG. 1 schematically shows a construction of an exposure apparatus according to an embodiment.

An embodiment will be explained below on the basis of the accompanying drawings. FIG. 1 schematically shows a construction of an exposure apparatus according to the embodiment. With reference to FIG. 1, the Z axis is set in the normal direction of a transfer surface (exposure surface) of a wafer W which is a photosensitive substrate, the Y axis is set in the direction parallel to the paper surface of FIG. 1 in the transfer surface of the wafer W, and the X axis is set in the direction perpendicular to the paper surface of FIG. 1 in the transfer surface of the wafer W.

With reference to FIG. 1, in the exposure apparatus of this embodiment, the exposure light (illumination light) is supplied from a light source LS. For example, an ArF excimer laser light source for supplying the light having a wavelength of 193 nm and a KrF excimer laser light source for supplying the light having a wavelength of 248 nm can be used as the light source LS. The light, which is allowed to outgo in the +Z direction from the light source LS, comes into a spatial light modulator 2 for polarization sorting (polarization classifying) via a beam sending unit 1. The light, which is allowed to outgo in the oblique direction via the spatial light modulator 2, comes into a spatial light modulator 4 for pupil formation (pupil generation) via a re-imaging optical system 3 composed of a front side lens group 3*a* and a back side lens group 3*b*.

A polarizing member 5 is arranged at the pupil position of the re-imaging optical system 3 or in the vicinity thereof. The beam sending unit 1 has such a function that the incoming light beam from the light source LS is guided to the spatial light modulators 2, 4 while converting the incoming light beam into the light beam having a cross section with an adequate size and shape, and that the position fluctuation and the angle fluctuation of the light beam allowed to come into the spatial light modulators 2, 4 are actively corrected. The beam sending unit 1 may be constructed such that the incoming light beam from the light source LS is not converted into the light beam having the cross section with the adequate size and shape.

As described later on, the spatial light modulators 2, 4 have a plurality of mirror elements which are aligned in a predetermined plane and which are individually controlled, and a driving unit which individually controls and drives the attitudes of the plurality of mirror elements on the basis of a control signal supplied from a control system CR. The polarizing member 5 has a plurality of ½ wavelength plates which are arranged in a parallel manner and which have mutually different polarizing functions (polarizing actions). The constructions and the functions of the spatial light modulators 2, 4 and the polarizing member 5 will be described later on.

The light, which is allowed to outgo in the +Z direction from the spatial light modulator 4, comes into a pupil plane 6*c* of a relay optical system 6 via a front side lens group 6*a* of the relay optical system 6. The front side lens group 6*a* is set so that the front focal position thereof is substantially coincident with the position of the arrangement plane of the plurality of mirror elements of the spatial light modulator 4 (hereinafter referred to as "arrangement plane of the spatial light modulator") and the back focal position thereof is substantially coincident with the position of the pupil plane 6*c*. As described later on, the light, which passes through the spatial light modulator 4, variably forms, on the pupil plane 6*c*, the light intensity distribution corresponding to the attitudes of the plurality of mirror elements. The light, which forms the light intensity distribution on the pupil plane 6*c*, comes into a relay optical system 7 via a back side lens group 6*b* of the relay optical system 6.

The light, which passes through the relay optical system 7, is reflected in the direction by an optical path bending mirror MR1, and the reflected light comes into a micro fly's-eye lens (or a fly's-eye lens) 8. The back side lens group 6*b* and the relay optical system 7 set the pupil plane 6*c* and the incident surface or incoming surface of the micro fly's-eye lens 8 to be optically conjugate. Therefore, the light, which passes through the spatial light modulator 4, forms the light intensity distribution corresponding to the light intensity distribution formed on the pupil plane 6*c*, on the incident surface of the micro fly's-eye lens 8 arranged at the position optically conjugate with the pupil plane 6*c*.

The micro fly's-eye lens 8 is the optical element which is composed of, for example, a large number of micro lenses having e positive refractive power arranged densely in the longitudinal and lateral directions. The micro fly's-eye lens 8 is constructed by forming a micro lens group by applying the etching treatment to a plane-parallel plate. In the micro fly's-eye lens, a large number of micro lenses (micro refracting surfaces) are formed integrally without being isolated from each other, unlike any fly's-eye lens composed of mutually isolated lens elements. However, the micro fly's-eye lens s the optical integrator of the wavefront division type like the fly's-eye lens in that the lens elements are arranged longitudinally and laterally.

The rectangular micro refracting surface, which serves as the unit wavefront dividing surface of the micro fly's-eye lens 8, has the rectangular shape similar to the shape of the illumination field to be formed on the mask M (consequently the shape the exposure area to be formed on the wafer W). For example, a cylindrical micro fly's-eye lens can be also used as the micro fly's-eye lens 8. The construction and the function of the cylindrical micro fly's-eye lens are disclosed, for example, in U.S. Pat. No. 6,913,373.

The light beam, which is allowed to come into the micro fly's-eye lens 8, is divided two-dimensionally by a large number of micro lenses, and a secondary light source (substantial surface light source composed of a large number of small light sources: pupil intensity distribution), which has approximately the same light intensity distribution as the light intensity distribution formed on the incident surface, is formed on the back focal plane or the illumination pupil defined in the vicinity thereof. The light beam, which comes from the secondary light source formed on the illumination pupil defined just downstream from the micro fly's-eye lens 8, illuminates a mask blind 10 in a superimposed manner via a condenser optical system 9.

Thus, an illumination field which has a rectangular shape depending on the focal distance and the shape of the rectangular micro refracting surface of the micro fly's-eye lens 8, is formed on the mask blind 10 as the illumination field diaphragm. An illumination aperture diaphragm, which has an aperture (light transmitting portion) having a shape corresponding to the secondary light source, may be arranged on the back focal plane of the micro fly's-eye lens 8 or in the vicinity thereof, i.e., at the position approximately optically conjugate with the entrance pupil plane of the projection optical system PL described later on.

The light beam, which passes through the rectangular aperture (light transmitting portion) of the mask blind 10, undergoes the light collecting action of an imaging optical system 11, and the light beam is reflected in the −Z direction by a mirror MR2 arranged in the optical path of the imaging optical system 11. After that, the light beam illuminates the mask M on which a predetermined pattern is formed, in a superimposed manner. That is, the imaging optical system 11 forms, on the mask M, the image of the rectangular aperture of the mask blind 10.

The light beam, which passes through the mask M held on a mask stage MS, forms an image of the mask pattern on the wafer (photosensitive substrate) W held on a wafer stage WS, via the projection optical system PL. In this way, the respective exposure areas of the wafer W are successively exposed with the pattern of the mask M by performing the full field exposure or the scanning exposure while two-dimensionally controlling and driving the wafer stage WS in the plane (XY plane) perpendicular to the optical axis AX of the projection optical system PL, and consequently two-dimensionally controlling and driving the wafer W. When the scanning exposure is performed, for example, the mask stage MS and the wafer stage WS may be driven in the Y direction at a velocity ratio corresponding to the magnification of the projection optical system PL.

The exposure apparatus of this embodiment is provided with a first pupil intensity distribution measuring unit DTr which measures the pupil intensity distribution on the exit pupil plane of the illumination optical system on the basis of the light allowed to pass through the illumination optical system (1 to 11), a second pupil intensity distribution measuring unit DTw which measures the pupil intensity distribution on the pupil plane of the projection optical system PL (exit pupil plane of the projection optical system PL) on the basis of the light allowed to pass through the projection optical system PL, and a control system CR which controls the spatial light modulators 2, 4 and which controls the operation of the exposure apparatus as a whole on the basis of the measurement result of at least one of the first and second pupil intensity distribution measuring units DTr, DTw.

The first pupil intensity distribution measuring unit DTr is provided with an image pickup unit which has a photoelectric conversion surface (plane) arranged, for example, at a position optically conjugate with the exit pupil position of the illumination optical system, and the first pupil intensity distribution measuring unit DTr monitors the pupil intensity distribution in relation to the respective points on the illumination objective surface to be illuminated by the illumination optical system (pupil intensity distribution formed at the exit pupil position of the illumination optical system by the light allowed to come into each of the points). Further, the second pupil intensity distribution measuring unit DTw is provided with an image pickup unit which has a photoelectric conversion surface (plane) arranged, for example, at a position optically conjugate with the pupil position of the projection optical system PL, and the second pupil intensity distribution measuring unit DTw monitors the pupil intensity distribution in relation to the respective points on the image plane of the projection optical system PL (pupil intensity distribution formed at the pupil position of the projection optical system PL by the light allowed to come into each of the points).

Reference can be made, for example, to United States Patent Application Publication No. 2008/0030707 about detailed constructions and functions of the first and second pupil intensity distribution measuring units DTr, DTw. Reference can be also made to the disclosure of United States Patent Application Publication No. 2010/0020302 in relation to the pupil intensity distribution measuring unit.

In this embodiment, the mask N arranged on the illumination objective surface of the illumination optical system (consequently the wafer W) is subjected to the Koehler illumination by using the light source of the secondary light source formed by the micro fly's-eye lens 8. Therefore, the position, at which the secondary light source is formed, is optically conjugate with the position of the aperture diaphragm AS of the projection optical system PL. The plane or surface, on which the secondary light source is formed, can be referred to as the illumination pupil plane of the illumination optical system. Further, the image of the plane (surface) on which the secondary light source is formed can be referred to as the exit pupil plane of the illumination optical system. Typically, the illumination objective surface (surface or plane on which the mask M is arranged, or the surface or plane on which the wafer W is arranged when the illumination optical system is regarded as including the projection optical system PL) is the optical Fourier transform plane (surface) with respect to the illumination pupil plane. The pupil intensity distribution is the light intensity distribution (luminance distribution) on the illumination pupil plane of the illumination optical system or the plane (surface) optically conjugate with the illumination pupil plane.

When the number of wavefront division by the micro fly's-eye lens 8 is relatively large the macroscopic (broader basis) light intensity distribution, which is formed on the incident surface of the micro fly's-eye lens 8, exhibits the high correlation with respect to the macroscopic (broader basis) light intensity distribution (pupil intensity distribution) of the entire secondary light source. Therefore, the light intensity distribution, which is provided on the incident surface of the micro fly's-eye lens 8 or the surface or plane optically conjugate with the incident surface concerned, can be also referred to as the pupil intensity distribution. In the construction shown in FIG. 1, the relay optical systems 6, 7 and the micro fly's-eye lens 8 constitute the means for forming the pupil intensity distribution on the illumination pupil defined just downstream from the micro fly's-eye lens 8 on the basis of the light beam allowed to pass through the spatial light modulator 4.

Figure 2:
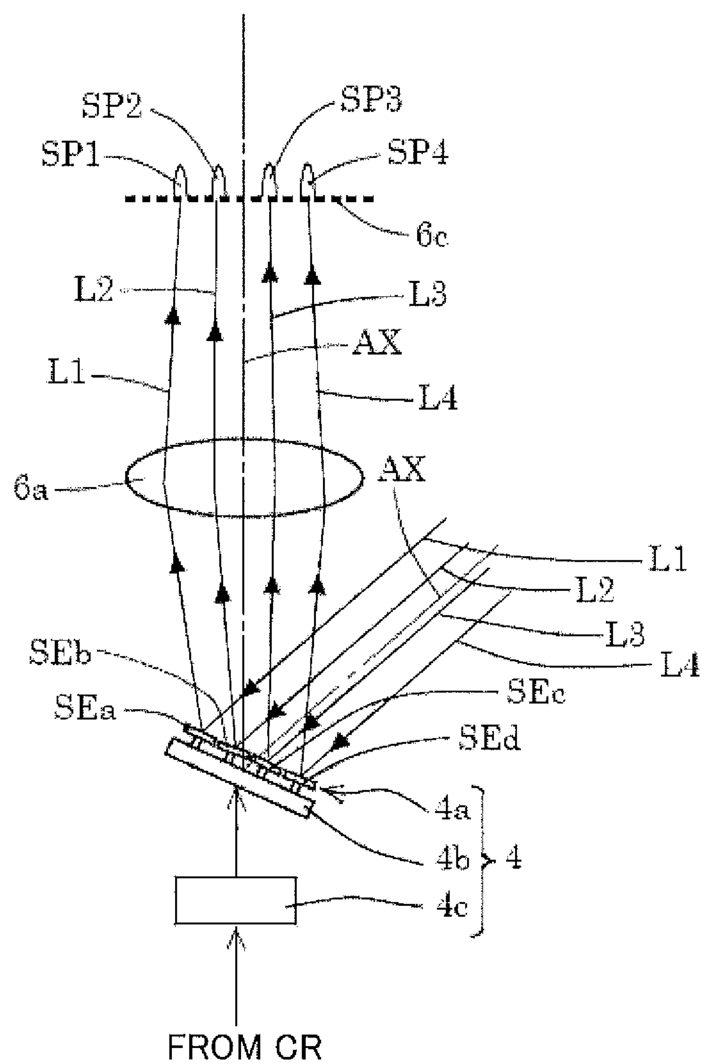
FIG. 2 illustrates a construction and a function of a spatial light modulator for pupil formation.

As shown in FIG. 2, the spatial light modulator 4 for pupil formation is provided with a plurality of mirror elements 4*a* which are aligned or arranged in a predetermined plane, a base 4*b* which holds the plurality of mirror elements 4*a*, and a driving unit 4*c* which individually controls and drives the attitudes of the plurality of mirror elements 4*a* via cables (not shown) connected to the base 4*b*. In the spatial light modulator 4, the attitudes of the plurality of mirror elements 4*a* are changed respectively by the action of the driving unit 4*c* operated on the basis of the instruction from the control system CR, and the respective mirror elements 4*a* are set in predetermined directions.

Figure 3:
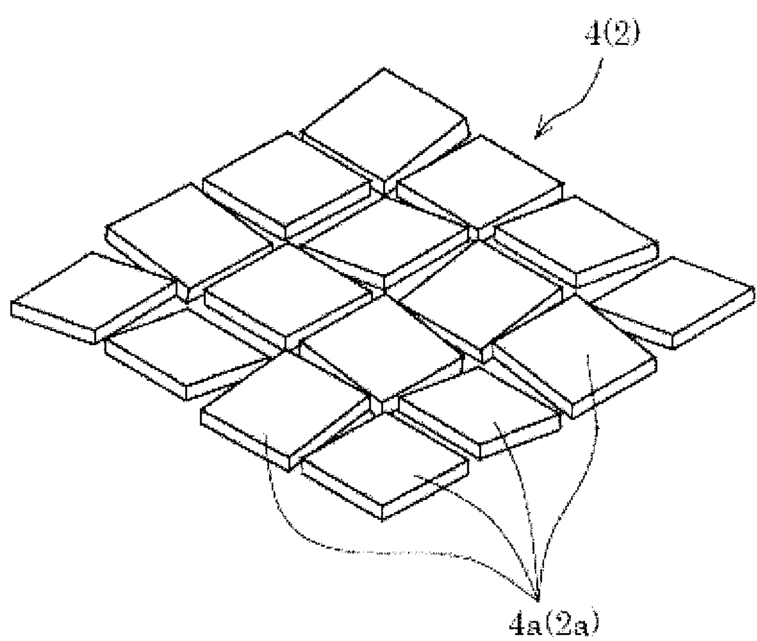
FIG. 3 shows a partial perspective view illustrating main parts or components of the spatial light modulator.

As shown in FIG. 3, the spatial light modulator 4 is provided with a plurality of micro mirror elements 4*a* which are aligned two-dimensionally, and the spatial light modulator 4 variably gives the spatial modulation to the incident light, the spatial modulation depending on the incident position of the incident light, and then emits the modulated light. In order to simplify the explanation and the illustration, FIGS. 2 and 3 show an exemplary construction in which the spatial light modulator 4 is provided with 4×4=16 pieces of the mirror elements 4*a*. However, actually, the spatial light modulator 4 is provided with a large number of mirror elements 4*a*, the number being much larger than sixteen.

With reference to FIG. 2, as for those of the light beam group allowed to come into the spatial light modulator 4, the light beam L1 comes into the mirror element SEa of the plurality of mirror elements 4*a*, and the light beam L2 comes into the mirror element SEb different from the mirror element SEa. Similarly, the light beam L3 comes into the mirror element SEc different from the mirror elements SEa, SEb, and the light beam L4 comes into the mirror element SEd different from the mirror elements SEa to SEc. The mirror elements SEa to SEd give the spatial modulations set depending on the positions thereof, to the light beams L1 to L4.

The spatial light modulator 4 is constructed such that the light beam, which comes in the direction parallel to the optical axis AX of the optical path between the spatial light modulators 2 and 4, travels in the direction parallel to the optical axis AX of the optical path between the spatial light modulator 4 and the relay optical system 6 after being reflected by the spatial light modulator 4, in the reference state in which the reflecting surfaces of all of the mirror elements 4*a* are set along one flat surface (plane). As described above, the arrangement plane of the spatial light modulator 4 is positioned at the front focal position of the front side lens group 6*a* of the relay optical system 6 or in the vicinity thereof.

Therefore, the light beams, which are reflected by the plurality of mirror elements SEa to SEd of the spatial light modulator 4 and to which predetermined angle distributions are given, form predetermined light intensity distributions SP1 to SP4 on the pupil plane 6*c* of the relay optical system 6, and the light beams consequently form light intensity distribution corresponding to the light intensity distributions SP1 to SP4 on the incident surface of the micro fly's-eye lens 8. That is, the angles, which are given by the plurality of mirror elements SEa to SEd of the spatial light modulator 4 to the outgoing light, are converted by the front side lens group 6*a* into the positions on the pupil plane 6*c* which is the far field of the spatial light modulator 4 (Fraunhofer diffraction area). Thus, the light intensity distribution (pupil intensity distribution) of the secondary light source formed by the micro fly's-eye lens 8 is the distribution corresponding to the light intensity distribution formed on the incident surface of the micro fly's-eye lens 8 by the spatial light modulator 4 and the relay optical systems 6, 7.

As shown in FIG. 3, the spatial light modulator 4 is the movable multi-mirror including the mirror elements 4*a* which are the large number of micro reflecting elements arranged or aligned regularly and two-dimensionally along one flat surface or plane in the state in which the planar reflecting surfaces are the upper surfaces. The respective mirror elements 4*a* are movable. The inclinations of the reflecting surfaces thereof, i.e., the angles of inclination and the directions of inclination of the reflecting surfaces are independently controlled by the action of the driving unit 4*c* operated on the basis of the control signal fed from the control system CR. Each of the mirror elements 4*a* can be rotated continuously or discretely by a desired angle of rotation about the rotation axes in the two directions parallel to the reflecting surface thereof, the two directions being perpendicular to one another. That is, the inclination of the reflecting surface of each of the mirror elements 4*a* can be controlled two-dimensionally.

When the reflecting surface of each of the mirror elements 4*a* is rotated discretely, it is appropriate to control the angle of rotation such that the angle is switched among a plurality of states (for example, . . . , −2.5 degrees, −2.0 degrees, . . . , 0 degree, +0.5 degree, . . . , +2.5 degrees, . . . ). FIG. 3 shows the mirror elements 4*a* having square contours. However, the contour shape of the mirror element 4*a* is not limited to the square. However, in view of the light utilization efficiency, it is possible to adopt a shape (shape capable of close packing) in which the mirror elements 4*a* can be arranged so that the gap between the mirror elements 4*a* is decreased. Further, in view of the light utilization efficiency, the spacing distance between the two adjoining mirror elements 4*a* can be suppressed to be minimum requirement.

In this embodiment, for example, the spatial light modulator, in which the directions of the plurality of mirror elements 4*a* arranged two-dimensionally are changed continuously respectively, is used as the spatial light modulator 4. As for the spatial light modulator as described above, it is possible to use any spatial light modulator disclosed, for example, in European Patent Application Publication No. 779530, U.S. Pat. Nos. 5,867,302, 6,480,320, 6,600,591, 6,733,144, 6,900,915, 7,095,546, 7,295,726, 7,424,330, and 7,567,375, United States Patent Application Publication No. 2008/0309901, International Patent Application Publication Nos. WO2010/037476 and WO2010/040506, and Japanese Patent Application Laid-open No. 2006-113437. The directions of the plurality of mirror elements 4*a* arranged two-dimensionally may be controlled discretely and in multi-stage manner.

In the spatial light modulator 4, the attitudes of the plurality of mirror elements 4*a* are changed respectively by the action of the driving unit 4*c* operated in response to the control signal supplied from the control system CR, and the respective mirror elements 4*a* are set in the predetermined directions. The light beams, which are reflected at the predetermined angles respectively by the plurality of mirror elements 4*a* of the spatial light modulator 4, form the desired pupil intensity distribution on the illumination pupil defined just downstream from the micro fly's-eye lens 8. Further, the desired pupil intensity distribution is also formed at positions of other illumination pupils optically conjugate with the illumination pupil defined just downstream from the micro fly's-eye lens 8, i.e., at the pupil position of the imaging optical system 11 and the pupil position of the projection optical system PL (position at which the aperture diaphragm AS is arranged).

As described above, the spatial light modulator 4 for pupil formation has the function to variably form the pupil intensity distribution on the illumination pupil defined just downstream from the micro fly's-eye lens 8. The relay optical systems 6, 7 constitute the distribution forming optical system which images the far field pattern, which is formed by the plurality of mirror elements 4*a* of the spatial light modulator 4 in the far field, onto the position conjugate with the illumination pupil defined just downstream from the micro fly's-eye lens 8 (incident surface of the micro fly's-eye lens 8 or the vicinity thereof). The distribution forming optical system converts the distribution in the angle direction of the outgoing light beam from the spatial light modulator 4 into the position distribution on the cross section of the outgoing light beam from the distribution forming optical system.

The spatial light modulator 2 for polarization sorting is constructed in the same manner as the spatial light modulator 4 for pupil formation. However, the spatial light modulator 2 for polarization sorting has the action (function) different from the spatial light modulator 4. In the following description, any explanation duplicate with the explanation about the spatial light modulator 4 will be omitted, and the spatial light modulator 2 will be explained while taking notice of the points or features different from those of the spatial light modulator 4. In other words, the points or features, which are not especially referred to in relation to the construction of the spatial light modulator 2, are the same as or equivalent to those of the construction of the spatial light modulator 4.

Figure 4:
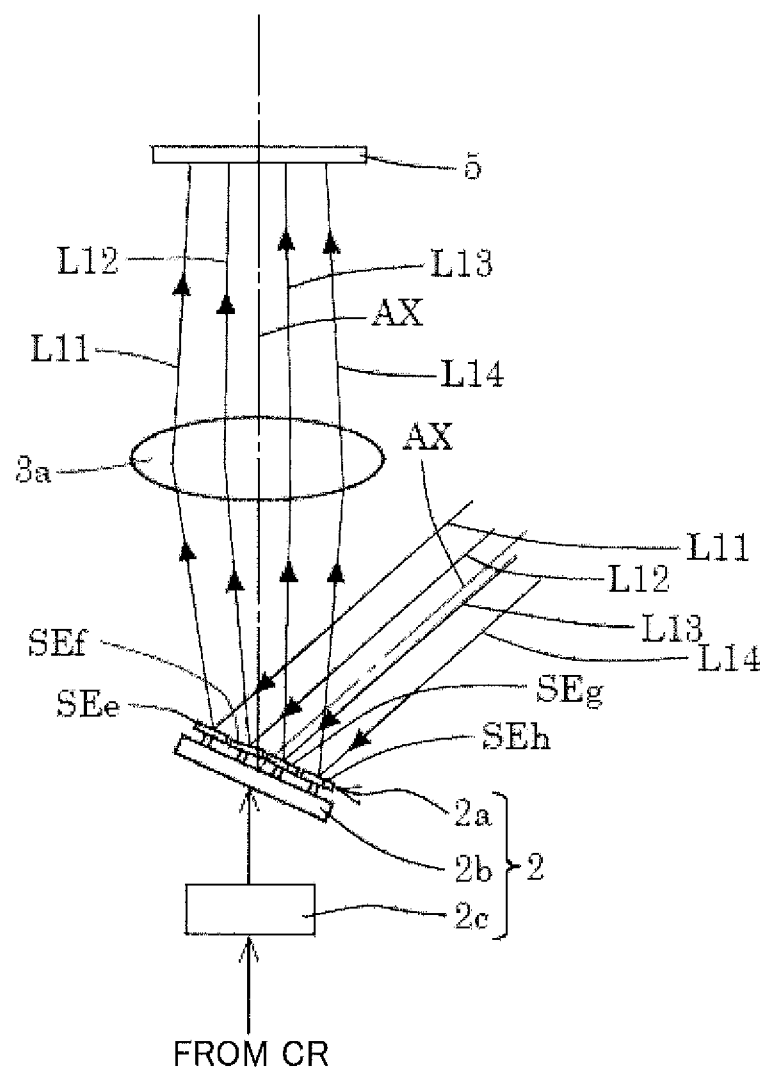
FIG. 4 illustrates a construction and a function of a spatial light modulator for polarization sorting.

As shown in FIG. 4, the spatial light modulator 2 is provided with a plurality of mirror elements 2*a* which are arranged in a predetermined plane, a base 2*b* which holds the plurality of mirror elements 2*a*, and a driving unit 2*c* which individually controls and drives the attitudes of the plurality of mirror elements 2*a* via cables (not shown) connected to the base 2*b*. In FIG. 4, components or parts ranging from the spatial light modulator 2 to the polarizing member 5 are shown in a state in which the optical axis AX is coincident with the vertical direction in FIG. 4 so that the explanation of the spatial light modulator 4 can be understood with ease while making comparison with the spatial optical modulator 2.

In the spatial light modulator 2, the attitudes of the plurality of mirror elements 2*a* are changed respectively by the action of the driving unit 2*c* operated on the basis of the instruction from the control system CR, and the respective mirror elements 2*a* are set in predetermined directions. As shown in FIG. 3, the spatial light modulator 2 is provided with a plurality of micro mirror elements 2*a* which are arranged two-dimensionally, and the spatial light modulator 2 variably gives the spatial modulation to the incident light, the spatial modulation depending on the incident position of the incident light, and then emits the modulated light.

With reference to FIG. 4, as for those of the light beam group allowed to come into the spatial light modulator 2, the light beam L11 comes into the mirror element SEe of the plurality of mirror elements 2*a*, and the light beam L12 comes into the mirror element SEf different from the mirror element SEe. Similarly, the light beam L13 comes into the mirror element SEg different from the mirror elements SEe, SEf, and the light beam L14 comes into the mirror element SEh different from the mirror elements SEe to SEg. The mirror elements SEe to SEh give the spatial modulations set depending on the positions thereof, to the light beams L11 to L14.

The spatial light modulator 2 is constructed such that the light beam, which comes in the direction parallel to the optical axis AX of the optical path between the beam sending unit 1 and the spatial light modulator 2, travels in the direction parallel to the optical axis AX of the optical path between the spatial light modulators 2 and 4 after being reflected by the spatial light modulator 2, in the reference state in which the reflecting surfaces of all of the mirror elements 2*a* are set along one flat surface (plane). As described above, the polarizing member 5 is positioned at the position which is in an optical Fourier transform relation with the arrangement plane of the spatial light modulator 2 or in the vicinity thereof.

Therefore, the angles, which are given by the plurality of mirror elements SEe to SEh of the spatial light modulator 2 to the outgoing light, are converted by the front side lens group 3*a* of the re-imaging optical system 3 into the positions on the incident surface of the polarizing member 5 which is the far field of the spatial light modulator 2. In this way, the spatial light modulator 2 for polarization sorting has such a function that the light, which comes into an arbitrary area of the incident surface, is variably guided to a desired area on the incident surface of the polarizing member 5 via the front side lens group 3*a* as the relay optical system.

Figure 5:
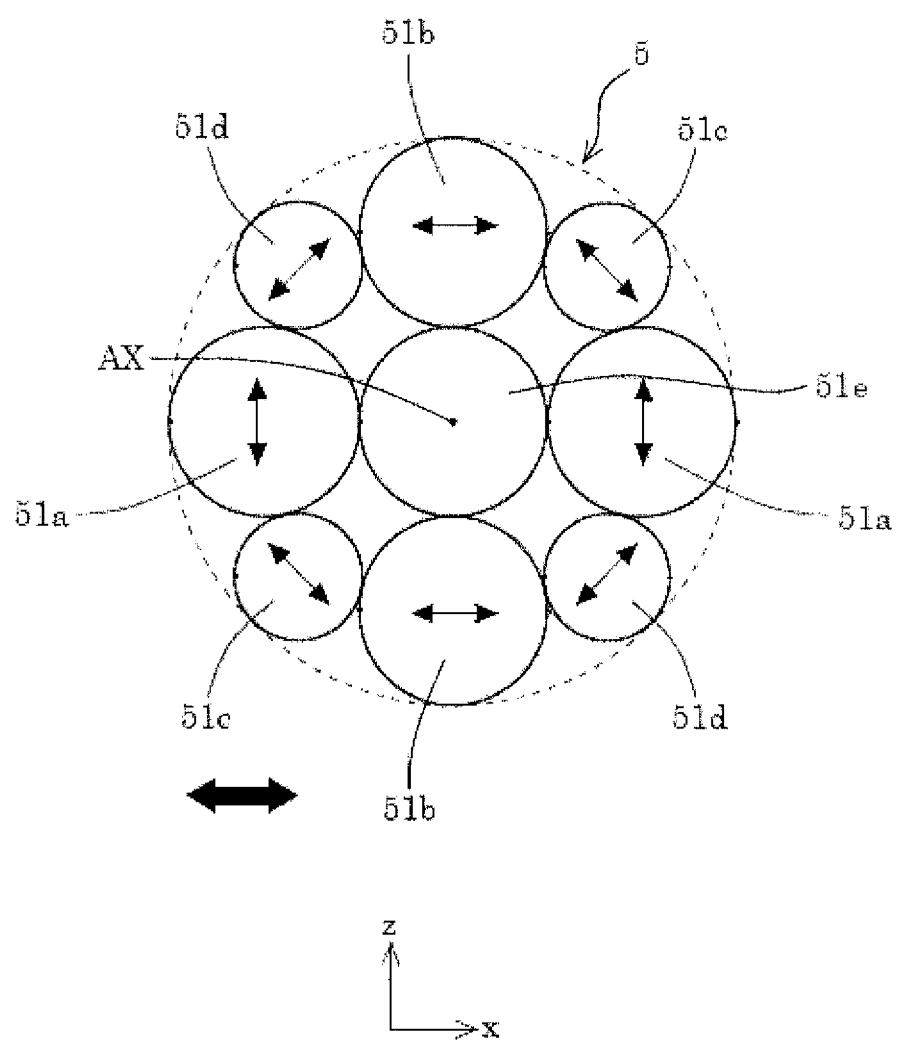
FIG. 5 schematically shows a construction of a polarizing member of the embodiment.

As shown in FIG. 5, the polarizing member 5 is provided with eight ½ wavelength plates 51*a*, 51*b*, 51*c*, 51*d* which are arranged in a parallel manner in the optical path, and one depolarizer (depolarizing element) 51*e*. For example, the ½ wavelength plates 51*a* to 51*d* and the depolarizer 51*e* are arranged along a single plane perpendicular to the optical axis AX. In FIG. 5, in order to make the explanation easier to understand, the x direction is set in the direction parallel to the X direction in the incident surface of the polarizing member 5, and the z direction is set in the direction perpendicular to the x direction in the incident surface of the polarizing member 5.

In the installation condition shown in FIG. 5, as for the pair of ½ wavelength plates 51*a*, the direction of the optic axis is set so that when the linearly polarized light having the polarization direction in the x direction (hereinafter referred to as "x direction linear polarization") is allowed to come thereinto, the light of z direction linear polarization, which has the polarization direction in the direction obtained by rotating the x direction by 90 degrees, i.e., in the z direction, is allowed to outgo. As for the pair of ½ wavelength plates 51*b*, the direction of the optic axis is set so that when the light of x direction linear polarization is allowed to come thereinto, the light of x direction linear polarization is allowed to outgo without undergoing any change in the polarization direction.

As for the pair of ½ wavelength plates 51*c*, the direction of the optic axis is set so that when the light of x direction linear polarization is allowed to come thereinto, the light of linear polarization, which has the polarization direction in the direction obtained by rotating the x direction by +45 degrees clockwise as viewed in FIG. 5, i.e., in the +45 degrees oblique direction, is allowed to outgo. As for the pair of ½ wavelength plates 51*d*, the direction of the optic axis is set so that when the light of x direction linear polarization is allowed to come thereinto, the light of linear polarization, which has the polarization direction in the direction obtained by rotating the x direction by −45 degrees (or +135 degrees) clockwise as viewed in FIG. 5, i.e., in the −45 degrees oblique direction, is allowed to outgo.

The arrangement plane of the spatial light modulator 4 for pupil formation is disposed at the position optically conjugate with the arrangement plane of the spatial light modulator 2 for polarization sorting or in the vicinity thereof with the re-imaging optical system 3 intervening therebetween. Therefore, the property of the incoming (incident) light beam allowed to come into the spatial light modulator 4 corresponds to the property of the incoming (incident) light beam allowed to come into the spatial light modulator 2. In the following description, in order to make the explanation easier to understand, it is assumed that the parallel light beam of X direction linear polarization, which has the rectangular cross section, comes into the spatial light modulator 2. That is, the light of x direction linear polarization comes into the polarizing member 5. The parallel light beam having the rectangular cross section comes into the spatial light modulator 4.

Figure 6:
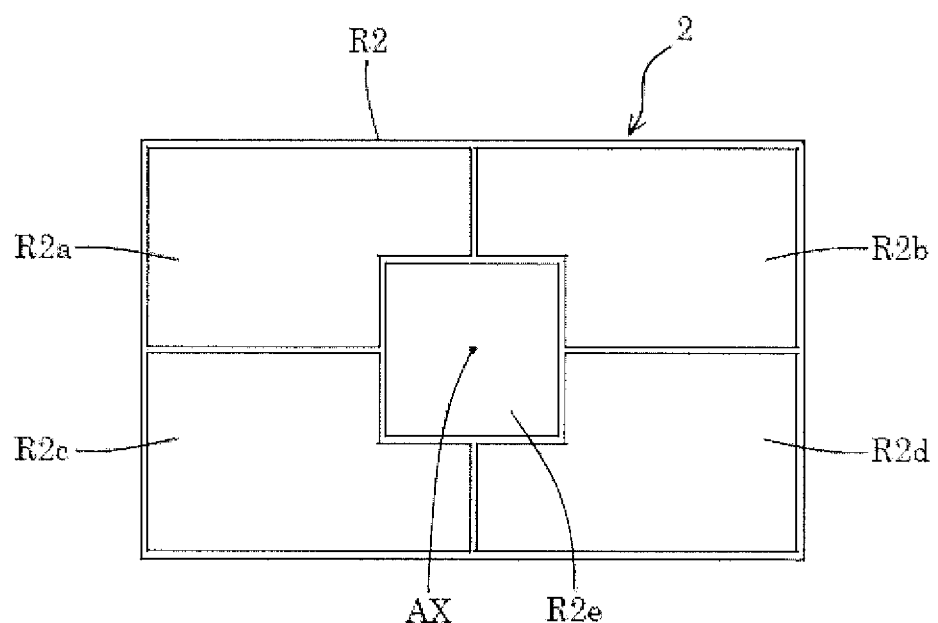
FIG. 6 shows a situation in which an effective reflection area of the spatial light modulator for polarization sorting is virtually divided into five partial areas.
Figure 7:
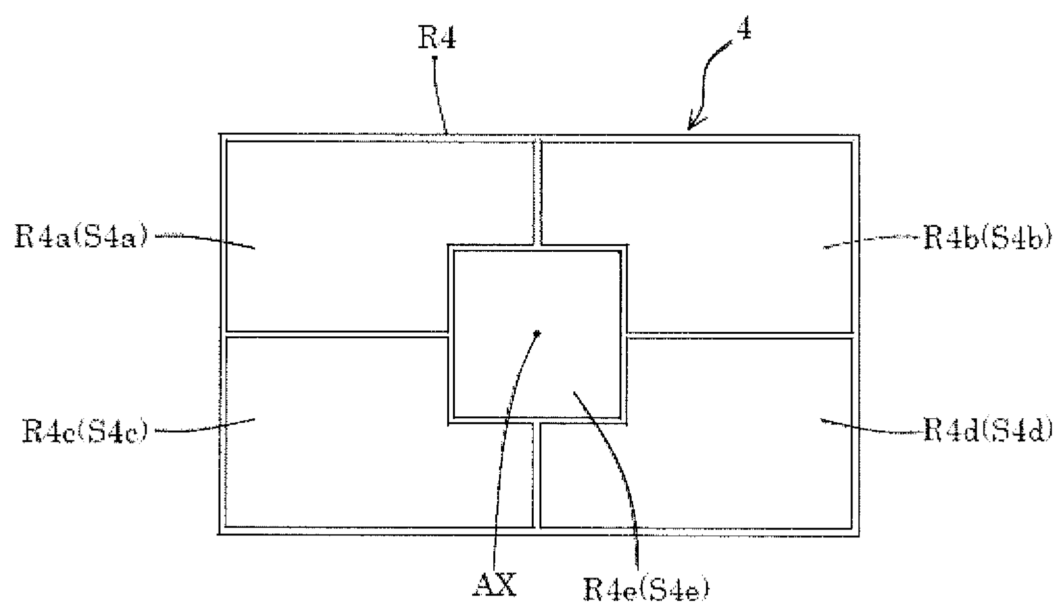
FIG. 7 shows a situation in which an effective reflection area of the spatial light modulator for pupil formation is virtually divided into five partial areas.

In this embodiment, as shown in FIG. 6, the effective reflection area R2 of the spatial light modulator 2 for polarization sorting is virtually divided into five partial areas R2*a*, R2*b*, R2*c*, R2*d*, R2*e*. Corresponding to the five partial areas R2*a* to R2*e*, as shown in FIG. 7, the effective reflection area R4 of the spatial light modulator 4 for pupil formation is virtually divided into five partial areas R4*a*, R4*b*, R4*c*, R4*d*, R4*e*. As for the way of virtual division of the effective reflection areas of the spatial light modulators 2, 4, it is possible to adopt various forms.

The light of X direction linear polarization, which comes into the partial area R2*a* of the spatial light modulator 2, is guided to the pair of ½ wavelength plates 51*a* of the polarizing member 5. The guided light is converted into the light of z direction linear polarization via the ½ wavelength plates 51*a*, and the converted light arrives at the partial area R4*a* of the spatial light modulator 4. The light of X direction linear polarization, which comes into the partial area R2*b* of the spatial light modulator 2, is guided to the pair of ½ wavelength plates 51*b* of the polarizing member 5. The guided light arrives at the partial area R4*b* of the spatial light modulator 4 in the state of x direction linear polarization without being subjected to the change of the polarization direction via the ½ wavelength plates 51*b*.

The light of X direction linear polarization, which comes into the partial area R2*c* of the spatial light modulator 2, is guided to the pair of ½ wavelength plates 51*c* of the polarizing member 5. The guided light is converted into the light of +45 degrees oblique direction linear polarization having the polarization direction in the +45 degrees oblique direction via the ½ wavelength plates 51*c*, and the converted light arrives at the partial area R4*c* of the spatial light modulator 4. The light of X direction linear polarization, which comes into the partial area R2*d* of the spatial light modulator 2, is guided to the pair of ½ wavelength plates 51*d* of the polarizing member 5. The guided light is converted into the light of −45 degrees oblique direction linear polarization having the polarization direction in the −45 degrees oblique direction via the ½ wavelength plates 51*d*, and the converted light arrives at the partial area R4*d* of the spatial light modulator 4.

Figure 8:
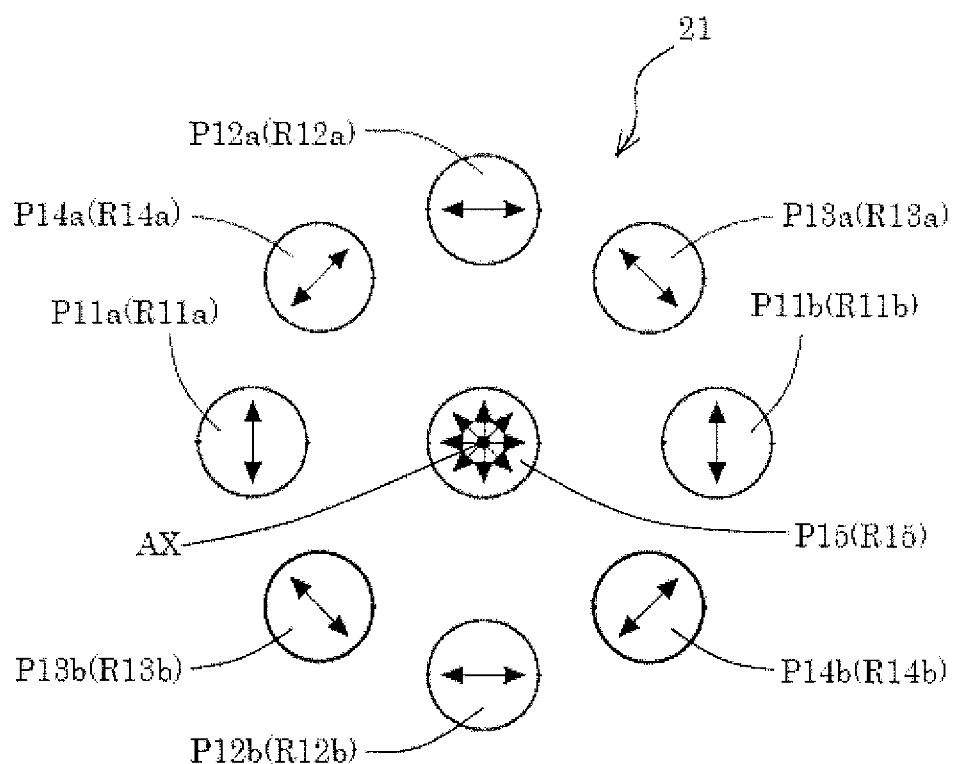
FIG. 8 shows a nine pole-shaped pupil intensity distribution obtained by adding a center pole surface light source to an eight pole-shaped pupil intensity distribution in a circumferential direction polarization state.
Figure 8:
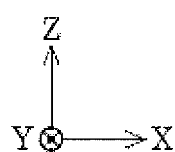

The light of X direction linear polarization, which comes into the partial area R2*e* of the spatial light modulator 2, is guided to the depolarizer 51*e* of the polarizing member 5. The guided light is converted into the light in the non-polarization (depolarized) state via the depolarizer 51*e*, and the converted light arrives at the partial area R4*e* of the spatial light modulator 4. As shown in FIG. 8, the driving unit 4*c* of the spatial light modulator 4 controls the attitudes of the plurality of mirror elements 4*a* belonging to the first mirror element croup S4*a* respectively so that the light, which passes through the first mirror element group S4*a* positioned in the partial area R4*a*, is guided to a pair of pupil areas R11*a*, R11*b* on the illumination pupil plane defined just downstream from the micro fly's-eye lens 8. The pair of pupil areas R11*a*, R11*b* are, for example, the areas spaced in the X direction with the optical axis AX intervening therebetween.

The driving unit 4*c* controls the attitudes of the plurality of mirror elements 4*a* belonging to the second mirror element group S4*b* respectively so that the light, which passes through the second mirror element group S4*b* positioned in the partial area R4*b*, is guided to a pair of pupil areas R12*a*, R12*b* on the illumination pupil plane. The pair of pupil areas R12*a*, R12*b* are, for example, the areas spaced in the Z direction with the optical axis AX intervening therebetween. The driving unit 4*c* controls the attitudes of the plurality of mirror elements 4*a* belonging to the third mirror element group S4*c* respectively so that the light, which passes through the third mirror element group S4*c* positioned in the partial area R4*c*, is guided to a pair of pupil areas R13*a*, R13*b* on the illumination pupil plane. The pair of pupil areas R13*a*, R13*b* are, for example, the areas spaced in the direction to form 45 degrees with respect to the +X direction and the +Z direction with the optical axis AX intervening therebetween.

The driving unit 4*c* controls the attitudes of the plurality of mirror elements 4*a* belonging to the fourth mirror element group S4*d* respectively so that the light, which passes through the fourth mirror element group S4*d* positioned in the partial area R4*d*, is guided to a pair of pupil areas R14*a*, R14*b* on the illumination pupil plane. The pair of pupil areas R14*a*, R14*b* are, for example, the areas spaced in the direction to form 45 degrees with respect to the −X direction and the +Z direction with the optical axis AX intervening therebetween. The driving unit 4*c* controls the attitudes of the plurality of mirror elements 4*a* belonging to the fifth mirror element group S4*e* respectively so that the light, which passes through the fifth mirror element group S4*e* positioned in the partial area R4*e*, is guided to a single pupil area R15 on the illumination pupil plane. The pupil area R15 is, for example, the area including the optical axis AX.

Thus, the spatial light modulator 4 forms a nine pole-shaped pupil intensity distribution 21 composed of, for example, nine circular substantial surface light sources P11*a*, P11*b*; P12*a*, P12*b*; P13*a*, P13*b*; P14*a*, P14*b*; P15 on the illumination pupil defined just downstream from the micro fly's-eye lens 8 on the basis of the parallel light beam having the rectangular cross section. The light, which forms the surface light sources P11*a*, P11*b* to occupy the pupil areas R11*a*, R11*b*, has passed through the ½ wavelength plates 51*a*, and hence the light is the Z direction linear polarization (corresponding to the z direction linear polarization shown in FIG. 5).

The light, which forms the surface light sources P12*a*, P12*b* to occupy the pupil areas R12*a*, R12*b*, has passed through the ½ wavelength plates 51*b*, and hence the light is the X direction linear polarization (corresponding to the x direction linear polarization shown in FIG. 5). The light, which forms the surface light sources P13*a*, P13*b* to occupy the pupil areas R13*a*, R13*b*, has passed through the ½ wavelength plates 51*c*, and hence the light is the +45 degrees oblique direction linear polarization having the polarization direction in the direction obtained by rotating the X direction by +45 degrees clockwise on the paper surface of FIG. 8 (corresponding to the +45 degrees oblique direction linear polarization shown in FIG. 5).

The light, which forms the surface light sources P14*a*, P14*b* to occupy the pupil areas R14*a*, R14*b*, has passed through the ½ wavelength plates 51*d*, and hence the light is the −45 degrees oblique direction linear polarization having the polarization direction in the direction obtained by rotating the X direction by −45 degrees clockwise on the paper surface of FIG. 8 (corresponding to the −45 degrees oblique direction linear polarization shown in FIG. 5). The light, which forms the surface light source P15 to occupy the pupil area R15, has passed through the depolarizer 51*e*, and hence the light is in the non-polarization (depolarized) state.

Thus, the nine pole-shaped pupil intensity distribution 21, obtained by adding the center pole surface light source P15 to the eight pole-shaped pupil intensity distribution in the circumferential direction (azimuthal direction) polarization state, is formed on the illumination pupil defined just downstream from the micro fly's-eye lens 8 by the cooperating action of the spatial light modulator 2 for polarization sorting, the polarizing member 5, and the spatial light modulator 4 for pupil formation. Further, the nine pole-shaped pupil intensity distribution, which corresponds to the pupil intensity distribution 21, is also formed at positions of other illumination pupils optically conjugate with the illumination pupil defined just downstream from the micro fly's-eye lens 8, i.e., the pupil position of the imaging optical system 11 and the pupil position of the projection optical system PL (position at which the aperture diaphragm AS is arranged).

Although not shown in the drawings, it is possible to form an eight pole-shaped pupil intensity distribution in the circumferential direction polarization state obtained by excluding the center pole surface light source P15 from the nine pole-shaped pupil intensity distribution 21 shown in FIG. 8 by guiding the light, which comes into the partial area R2*e* of the spatial light modulator 2 to the ½ wavelength plates 51*a* to 51*d* without guiding to the depolarizer 51*e*, and guiding the light, which comes into the partial area R4*e* of the spatial light modulator 4 to the pupil areas R11*a*, R11*b*; R12*a*, R12*b*; R13*a*, R13*b*; R14*a*, R14*b*. Alternatively, it is also possible to form an eight pole-shaped pupil intensity distribution in the circumferential direction polarization state by guiding the light, which has passed through the depolarizer 51*e* and the fifth mirror element group S4*e* of the spatial light modulator 4, for example, to the outside of the illumination optical path so that the light does not contribute to the formation of the illumination pupil.

In general, in the case of the circumferential direction polarized illumination based on the annular or multi-pole-shaped (for example, four pole-shaped or eight pole-shaped) pupil intensity distribution in the circumferential direction polarization state, the light, which is radiated onto the wafer W as the final illumination objective surface, is in the polarization state in which the s-polarized light is the main component. In this case, the s-polarized light is the linearly polarized light having the polarization direction in the direction perpendicular to the plane of incidence (polarized light having the electric vector vibrating in the direction perpendicular to the plane of incidence). The plane of incidence is defined as the plane which includes the light incident direction and the normal line of the boundary surface at the point provided when the light arrives at the boundary surface of the mediums (illumination objective surface (plane): surface of the wafer W). As a result, in the case of the circumferential direction polarized illumination, it is possible to improve the optical performance (for example, the depth of focus) of the projection optical system, and it is possible to obtain the mask pattern image having the high contrast on the wafer (photosensitive substrate).

In this embodiment, the spatial light modulator 4 for pupil formation, the spatial light modulator 4 having the large number of mirror elements 4*a* of which attitudes are controlled individually, is used. Therefore, the degree of freedom is high in relation to the change of the shape (broad concept including the size) of the pupil intensity distribution. For example, by merely controlling the spatial light modulator 4 in accordance with the instruction from the control system CR, as shown in FIG. 9, an annular pupil intensity distribution 22 in the circumferential direction polarization state can be formed on the illumination pupil defined just downstream from the micro fly's-eye lens 8.

Figure 9:
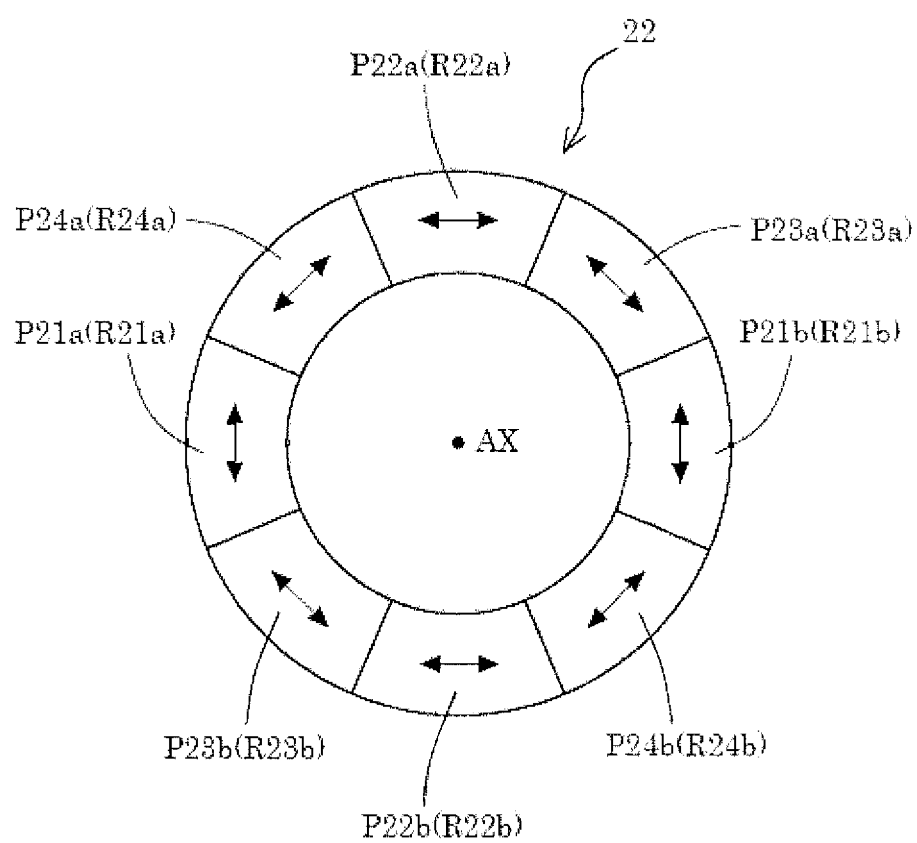
FIG. 9 shows an annular pupil intensity distribution in a circumferential direction polarization state.

In the example shown in FIG. 9, the light, which has passed through the ½ wavelength plates 51*a* and the first mirror element group S4*a*, is guided to a pair of circular arc-shaped pupil areas R21*a*, R21*b* on the illumination pupil plane, the areas being spaced in the X direction with the optical axis AX intervening therebetween, to form substantial surface light sources P21*a*, P21*b*. The light, which has passed through the ½ wavelength plates 51*b* and the second mirror element group S4*b*, is guided to a pair of circular arc-shaped pupil areas R22*a*, R22*b* spaced in the Z direction with the optical axis AX intervening therebetween to form substantial surface light sources P22*a*, P22*b*. The light, which has passed through the ½ wavelength plates 51*c* and the third mirror element group S4*c*, is guided to a pair of circular a shaped pupil areas R23*a*, R23*b* spaced in the direction to form 45 degrees with respect to the +X direction and the +Z direction with the optical axis AX intervening therebetween to form substantial surface light sources P23*a*, P23*b*.

The light, which has passed through the ½ wavelength plates 51*d* and the fourth mirror element group sod, is guided to a pair of circular arc-shaped pupil areas R24*a*, R24*b* spaced in the direction to form 45 degrees with respect to the −X direction and the +Z direction with the optical axis AX intervening therebetween to form substantial surface light sources P24*a*, P24*b*. The light, which has passed through the depolarizer 51*e* and the fifth mirror element group S4*e*, is guided, for example, to the outside of the illumination optical path, and the light does not contribute to the formation of the illumination pupil. Thus, the annular pupil intensity distribution 22 in the circumferential direction polarization state, which is composed of, for example, the eight circular arc-shaped substantial surface light sources P21*a*, P21*b*; P22*a*, P22*b*; P23*a*, P23*b*; P24*a*, P24*b*, is formed.

Alternatively, the light, which comes into the partial area. R2*e* of the spatial light modulator 2 is guided to the ½ wavelength plates 51*a* to 51*d* without being guided to the depolarizer 51*e*, and by guiding the light, which comes into the partial area R4*e* of the spatial light modulator 4, is guided to the pupil areas R21*a*, R21*b*; R22*a*, R22*b*; R23*a*, R23*b*; R24*a*, R24*b*, thereby making is possible to contribute to the formation of the illumination pupil. Although not shown in the drawings, the light, which comes into the partial area R2*e* of the spatial light modulator 2, may be guided to the central pupil area including the optical axis AX on the illumination pupil via the depolarizer 51*e*. By doing so, it is also possible to form a modified annular pupil intensity distribution obtained by adding the center pole surface light source P15 shown in FIG. 8 to the annular pupil intensity distribution 22 in the circumferential direction polarization state.

In this embodiment, the spatial light modulator 2 for polarization sorting, the spatial light modulator 2 having the large number of mirror elements 2*a* of which attitudes are individually controlled, is used. Therefore, the degree of freedom is high in relation to the change of the polarization state of the pupil intensity distribution. For example, by merely controlling the spatial light modulator 2 in accordance with the instruction from the control system CR, as shown in FIG. 10, it is possible to form a nine pole-shaped pupil intensity distribution 23 obtained by adding a center pole surface light source P35 to an eight pole-shaped pupil intensity distribution in the radial direction polarization state on the illumination pupil defined just downstream from the micro fly's-eye lens 8.

Figure 10:
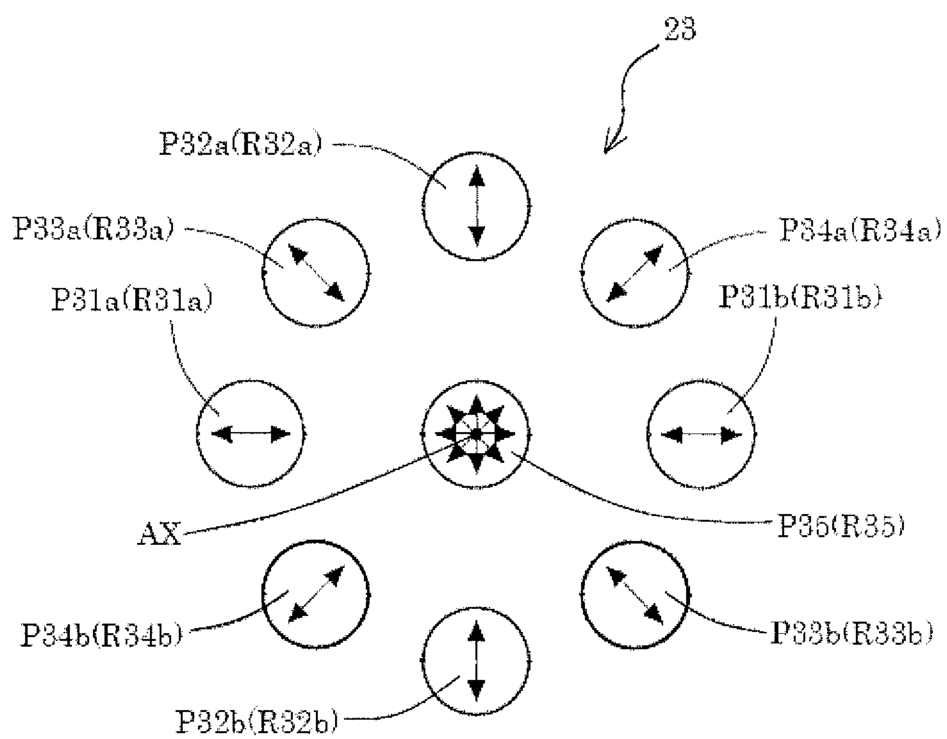
FIG. 10 shows a nine pole-shaped pupil intensity distribution obtained by adding a center pole surface light source to an eight pole-shaped pupil intensity distribution in a radial direction polarization state.
Figure 10:
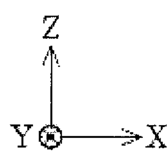

In the example shown in FIG. 10, the light, which comes from the partial area R2*a* of the spatial light modulator 2, passes through the ½ wavelength plates 51*b* of the polarizing member 5 and the first mirror element group S4*a* of the spatial light modulator 4, and the is guided to a pair of pupil areas R31*a*, R31*b* on illumination pupil plane, the pupil areas being spaced in the X direction with the optical axis AX intervening therebetween, to form substantial surface light sources P31*a*, P31*b*. The light, which comes from the partial area R2*b* of the spatial light modulator 2, passes through the ½ wavelength plates 51*a* and the second mirror element group S4*b*, and the light is guided to a pair of pupil areas R32*a*, R32*b* on the illumination pupil plane, the pupil areas being spaced in the Z direction with the optical axis AX intervening therebetween, to form substantial surface light sources P32*a*, P32*b*.

The light, which comes from the partial area R2*c* of the spatial light modulator 2, passes through the ½ wavelength plates 51*d* and the third mirror element group S4*c*, and the light is guided to a pair of pupil areas R33*a*, R33*b* on the illumination pupil plane, the pupil areas being spaced in the direction to form 45 degrees with respect to the −X direction and the direction with the optical axis AX intervening therebetween, to form substantial surface light sources P33*a*, P33*b*. The light, which comes from the partial area R2*d* of the spatial light modulator 2, passes through the ½ wavelength plates 51*c* and the fourth mirror element group S4*d*, and the light is guided to a pair of pupil areas R34*a*, R34*b* on the illumination pupil plane, the pupil areas being spaced in the direction to form 45 degrees with respect to the +X direction and the +Z direction with the optical axis AX intervening therebetween, to form substantial surface light sources P34*a*, P34*b*.

The light, which comes from the partial area R2*e* of the spatial light modulator 2, passes through the depolarizer 51*e* and the fifth mirror element group S4*e*, and the light is guided to the central pupil area R35 including the optical axis AX on the illumination pupil plane to form a substantial surface light source P35. Thus, it is formed the nine pole-shaped pupil intensity distribution 23 obtained by adding the center pole surface light source P35 to the eight pole-shaped pupil intensity distribution in the radial direction polarization state composed of, for example, the eight circular substantial surface light sources P31*a*, P31*b*; P32*a*, P32*b*; P33*a*, P33*b*; P34*a*, P34*b*.

Although not shown in the drawings, the light, which comes into the partial area R2*e* of the spatial light modulator 2, may be guided to the ½ wavelength plates 51*a* to 51*d* without being guided to the depolarizer 51*e*, and the light, which comes into the partial area R4*e* of the spatial light modulator 4, may be guided to the pupil areas R31*a*, R31*b*; R32*a*, R32*b*; R33*a*, R33*b*; R34*a*, R34*b*. By doing so, it is possible to form an eight pole-shaped pupil intensity distribution in the radial direction polarization state obtained by excluding the center pole surface light source P35 from the nine pole-shaped pupil intensity distribution 23 shown in FIG. 10. Alternatively, the light, which has passed through the depolarizer 51*e* and the fifth mirror element group S4*e* of the spatial light modulator 4, may be guided, for example, to the outside of the illumination optical path so that the light does not contribute to the formation of the illumination pupil. By doing so, it is also possible to form an eight pole-shaped pupil intensity distribution in the radial direction polarization state.

Although not shown in the drawings, an annular pupil intensity distribution in the radial direction polarization state, and a modified annular pupil intensity distribution, which is obtained by adding the center pole surface light source to the annular pupil intensity distribution in the radial direction polarization state, can be formed on the illumination pupil defined lust downstream from the micro fly's-eye lens 8 by controlling the spatial light modulator 4 in accordance with the instruction from the control system CR.

In general, in the case of the radial direction polarized illumination based on the annular or multi-pole-shaped pupil intensity distribution in the radial direction polarization state, the light, which is radiated onto the wafer W as the final illumination objective surface, is in the polarization state in which the p-polarized light is the main component. In this case, the p-polarized light is the linearly polarized light having the polarization direction in the direction parallel to the plane of incidence defined as described above (polarized light having the electric vector vibrating in the direction parallel to the plane of incidence). As a result, in the case of the radial direction polarized illumination, the reflectance of the light can be suppressed to be small on the resist with which the wafer W is coated, and it is possible to obtain the satisfactory image of the mask pattern on the wafer (photosensitive substrate).

As described above, in this embodiment, the spatial light modulator 4 for pupil formation, the spatial light modulator 4 having the large number of mirror elements 4*a* of which attitudes are individually controlled, is used. Therefore, the degree of freedom is high in relation to the change of the shape (broad concept including the size) of the pupil intensity distribution, and it is possible to form the annular or multi-pole-shaped pupil intensity distributions having various forms. Further, those used are the spatial light modulator 2 for polarization sorting, the spatial light modulator 2 having the large number of mirror elements 2*a* of which attitudes are individually controlled and being arranged at the position optically conjugate with the spatial light modulator 4, and the polarizing member 5 which has the plurality of wavelength plates 51*a* to 51*e* arranged in the parallel manner at the position in an optical Fourier transform relation with the spatial light modulator 2 and having the mutually different polarization conversion characteristics. Therefore, the degree of freedom is high in relation to the change of the polarization states of the respective pupil areas for constructing the pupil intensity distribution, and it is possible to form the pupil intensity distributions having various polarization states.

That is, in the case of the illumination optical system (1 to 11) of this embodiment, it is possible to provide the high degree of freedom regarding the change of the shape and the polarization state of the pupil intensity distribution formed on the illumination pupil defined just downstream from the micro fly's-eye lens 8 without involving the exchange of the optical member. In the case of the exposure apparatus (1 to WS) of this embodiment, it is possible to correctly transfer the fine pattern to the wafer W under the adequate illumination condition realized in accordance with the characteristic of the pattern of the mask M to be transferred by using the illumination optical system (1 to 11) having the high degree of freedom regarding the change of the shape and the polarization state of the pupil intensity distribution.

In the embodiment described above, the control system CR can be constructed by using, for example, a so-called work station. (or a microcomputer) composed of, for example, CPU (central processing unit), ROM (read only memory), and RAM (random access memory), and the control system CR can control the entire apparatus as a whole. Further, the control system CR may be externally connected with a storage device composed of, for example, a hard disk, an input device including, for example, a keyboard and a pointing device such as a mouse or the like, a display device including, for example a CRT display (or a liquid crystal display), and a drive device for an information storage medium including, for example, CD (compact disc), DVD (digital versatile disc), MO (magneto-optical disc), and FD (flexible disc).

In this embodiment, the storage device may be stored, for example, with the information regarding the pupil intensity distribution (illumination light source shape) by which the imaging state of the projection image projected onto the wafer W by the projection optical system PL is optimized (for example, the aberration or the line width is within the allowable range), and the control information for the illumination optical system, especially the mirror elements of the spatial light modulators 2, 4 corresponding thereto. An information storage medium (referred to as "CD-ROM" for the purpose of convenience in the following explanation), in which the programs or the like for performing a setting of the pupil intensity distribution as described later on are stored, may be set to the drive device. It is also allowable that the programs as described above may be installed to the storage device. The control system CR appropriately reads the programs onto the memory.

The control system CR can control the spatial light modulators 2, 4, for example, in accordance with the following procedure. In the following explanation, it is assumed that the exposure apparatus of the embodiment forms the pupil intensity distribution 21 shown in FIG. 8. The pupil intensity distribution can be expressed, for example, in such a form (bit-map form in a broad sense) that the pupil intensity distribution is expressed as numerical values using the light intensity and the polarizing state of each compartment, each compartment being obtained by dividing the pupil plane into a plurality of compartments in a lattice form. It is now assumed that the number of mirror elements of the spatial light modulator 4 is N and the number of divided compartments of the pupil intensity distribution is M. On this assumption, the pupil intensity distribution (secondary light source) is formed (set) by appropriately combining N pieces of the light beams reflected by the individual mirror elements so that the light beams are guided to M pieces of the compartments, in other words, by appropriately overlapping (overlaying) N pieces of the light beams on M pieces of bright spots made up by M pieces of the compartments.

At first, the control unit CR reads the information in relation to the pupil intensity distribution 21 as the target from the storage device. Subsequently, the control unit CR calculates what number of light beams are required respectively to form the intensity distributions for the respective polarization states from the read information in relation to the pupil intensity distribution 21. Further, the control unit CR virtually divides the plurality of mirror elements 4*a* of the spatial light modulator 4 into the five mirror element groups S4*a*, S4*b*, S4*c*, S4*d*, S4*e* each of which is composed of a required number of mirror elements, and the control unit CR sets the partial areas R4*a* to R4*e* at which the respective mirror element groups S4*a* to S4*e* are positioned. As a result, the partial areas R2*a* to R2*e* corresponding to the partial areas R4*a* to R4*e* of the spatial light modulator 4 are set in the spatial light modulator 2.

The control unit CR drives the mirror elements 2*a* positioned in the partial area R2*a* of the spatial light modulator 2 to make the setting so that the light from the partial area R2*a* is directed to the pair of ½ wavelength plates 51*a* of the polarizing member 5. Similarly, the control unit CR drives the mirror elements 2*a* positioned in the partial areas R2*b*, R2*c*, R2*d* to make the setting so that the light from the partial areas R2*b*, R2*c*, R2*d* is directed to the pair of ½ wavelength plates 51*b*, 51*c*, 51*d*. Further, the control unit CR drives the mirror elements 2*a* positioned in the partial area R2*e* to make the setting so that the light from the partial area R2*e* is directed to the depolarizer 51*e*.

Further, the control unit CR drives the mirror elements 4*a* of the first mirror element group S4*a* of the spatial light modulator 4 to make the setting so that the light from the first mirror element group S4*a* is directed to the surface light sources P11*a*, P11*b*. Similarly, the control unit CR drives the mirror elements 4*a* of the mirror element groups S4*b*, S4*c*, S4*d*, S4*e* of the spatial light modulator 4 to make the setting so that the light from the mirror element groups S4*b*, S4*c*, S4*d*, S4*e* is directed to the surface light sources P12*a*, P12*b*; P13*a*, P13*b*; P14*a*, P14*b*; P15.

Further, in the embodiment described above, the control unit CR controls at least one of the spatial light modulators 2, 4 in order to make the pupil intensity distribution on the exit pupil plane of the illumination optical system or the projection optical system into the required distribution on the basis of the measurement result of at least one of the first and second pupil intensity distribution measuring units DTr, DTw.

In this context, in the embodiment described above, in addition to the first and second pupil intensity distribution measuring units DTr, DTw, it is also allowable to provide a pupil polarization state distribution measuring unit for monitoring the distribution of the pupil polarization state in relation to the respective points on the illumination objective surface to be illuminated by the illumination optical system (pupil intensity distribution for each polarization state formed at the exit pupil position of the illumination optical system by the light allowed to come into each point) and/or the distribution of the pupil polarization state in relation to the respective points on the image plane of the projection optical system PL (pupil intensity distribution for each polarization state formed at the pupil position of the projection optical system PL by the light allowed to come into each point).

The control unit CR may control at least one of the spatial light modulators 2, 4 in order to make the distribution of the pupil polarization state on the exit pupil plane of the illumination optical system or the projection optical system into the required distribution on the basis of the measurement result of the pupil polarization state distribution measuring unit. As for the construction and the function of the pupil polarization state distribution measuring unit as described above, reference can be made, for example, to United States Patent Application Publication Nos. 2007/0146676 and 2007/0188730.

In the embodiment described above, the polarizing member 5 is constructed by the eight (four types of) ½ wavelength plates 51*a* to 51*d* and the depolarizer 51*e*, and the polarizing member 5 is arranged in the parallel manner at the pupil position of the re-imaging optical system 3 or in the vicinity thereof. However, there is no limitation thereto. It is possible to adopt various modified embodiments in relation to the specified construction of the polarizing member, i.e., for example, the type, the polarization conversion characteristic, the number, the contour (outer shape), and the arrangement of one polarization element or a plurality of polarization elements for forming the polarizing member.

Figure 11:
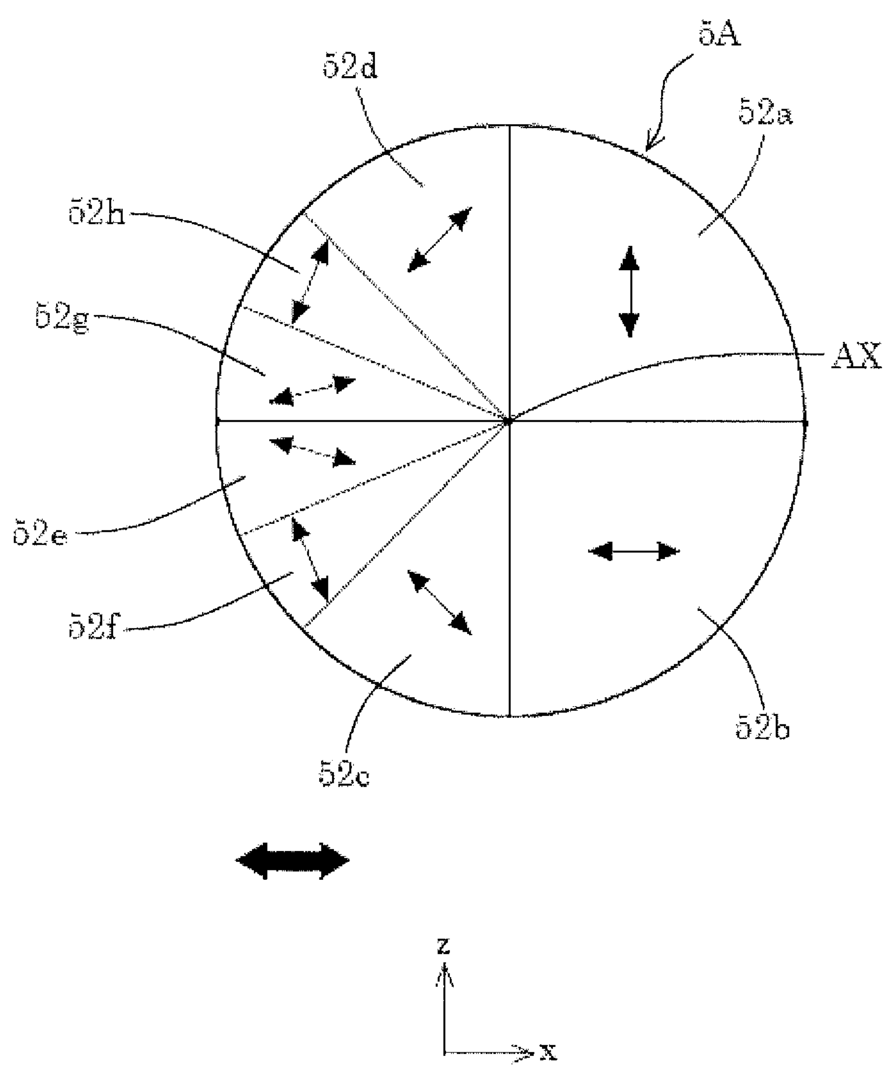
FIG. 11 schematically shows a construction of a polarizing member according to a first modified embodiment.

For example, as shown in FIG. 11, it is also possible to construct a polarizing member 5A by using eight ½ wavelength plates 52*a*, 52*b*, 52*c*, 52*d*, 52*e*, 52*f*, 52*g*, 52*h* having mutually different polarization conversion characteristics arranged in a parallel manner in the optical path. In the installation condition shown in FIG. 11, the polarizing member 5A has a contour which is, for example, a circle including the optical axis AX as the center, and the eight ½ wavelength plates 52*a* to 52*h* having mutually different optic axis directions are arranged corresponding to eight sectoral areas divided by line segments extending in the radial directions of the circle from the optical axis AX.

In FIG. 11, the ½ wavelength plate 52*a*, 52*b* occupies ¼ of the total area, the ½ wavelength plate 52*c*, 52*d* occupies ⅛ of the total area, and the ½ wavelength plate 52*e* to 52*h* occupies 1/16 of the total area. The ½ wavelength plate 52*a* has the direction of the optic axis which is set so that the light of z direction linear polarization is allowed to outgo when the light of x direction linear polarization is allowed to come thereinto. The ½ wavelength plate 52*b* has the direction of the optic axis which is set so that the light of x direction linear polarization is allowed to outgo without undergoing any change in the polarization direction when the light of x direction linear polarization is allowed to come thereinto.

The ½ wavelength plate 52*c* has the direction of the optic axis which is set so that the light of +45 degrees oblique direction linear polarization, which has the polarization direction in the direction obtained by rotating the x direction by +45 degrees clockwise as viewed in FIG. 11, i.e., the +45 degrees oblique direction, is allowed to outgo when the light of x direction linear polarization is allowed to come thereinto. The ½ wavelength plate 52*d* has the direction of the optic axis which is set so that the light of −45 degrees (or +135 degrees) oblique direction linear polarization is allowed to outgo when the light of x direction linear polarization is allowed to come thereinto.

The ½ wavelength plate 52*e* has the direction of the optic axis which is set so that the light of +22.5 degrees oblique direction linear polarization is allowed to outgo when the light of x direction linear polarization is allowed to come thereinto. The ½ wavelength plate 52*f* has the direction of the optic axis which is set so that the light of +67.5 degrees oblique direction linear polarization is allowed to outgo when the light of x direction linear polarization is allowed to come thereinto. The ½ wavelength plate 52*g* has the direction of the optic axis which is set so that the light of −22.5 degrees (or +112.5 degrees) oblique direction linear polarization is allowed to outgo. The ½ wavelength plate 52*h* has the direction of the optic axis which is set so that the light of −67.5 degrees (or +157.5 degrees) oblique direction linear polarization is allowed to outgo.

Figure 12:
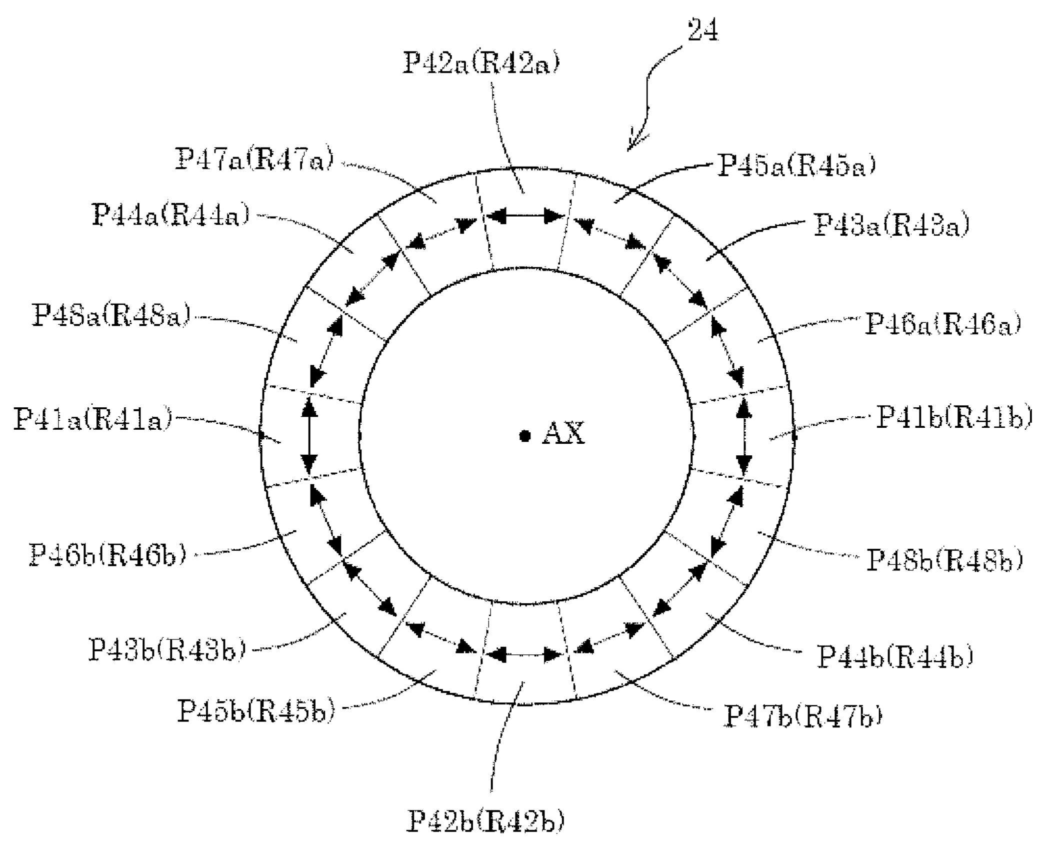
FIG. 12 shows an annular pupil intensity distribution of a sixteen-division type (divided into sixteen) in a circumferential direction polarization state.

In the modified embodiment shown in FIG. 11, the effective reflection area of the spatial light modulator 2, 4 is virtually divided into eight partial areas, and an annular pupil intensity distribution 24 as shown in FIG. 12 is formed by the collaboration among the spatial light modulators 2, 4 and the polarizing member 5A. That is, the light, which comes from the first partial area of the spatial light modulator 2, passes through the ½ wavelength plate 52*a* and the first partial area of the spatial light modulator 4, and the light is guided to a pair of circular arc-shaped pupil areas R41*a*, R41*b* on the illumination pupil plane, the pupil areas being spaced in the X direction with the optical axis AX intervening therebetween, to form substantial surface light sources P41*a*, P41*b*.

The light, which comes from the second partial area of the spatial light modulator 2, passes through the ½ wavelength plate 52*b* and the second partial area of the spatial light modulator 4, and the light is guided to a pair of circular arc-shaped pupil areas R42*a*, R42*b* on the illumination pupil plane, the pupil areas being spaced in the Z direction with the optical axis AX intervening therebetween, to form substantial surface light sources P42*a*, P42*b*. The light, which comes from the third partial area of the spatial light modulator 2, passes through the ½ wavelength plate 52*c* and the third partial area of the spatial light modulator 4, and the light is guided to a pair of circular arc-shaped pupil areas R43*a*, R43*b* on the illumination pupil plane, the pupil areas being spaced in the direction to form 45 degrees with respect to the +X direction and the +Z direction with the optical axis AX intervening therebetween, to form substantial surface light sources P43*a*, P43*b*.

The light, which comes from the fourth partial area of the spatial light modulator 2, passes through the ½ wavelength plate 52*d* and the fourth partial area of the spatial light modulator 4, and the light is guided to a pair of circular arc-shaped pupil areas R44*a*, R44*b* on the illumination pupil plane, the pupil areas being spaced in the direction to form 45 degrees with respect to the −X direction and the +Z direction with the optical axis AX intervening therebetween, to form substantial surface light sources P44*a*, P44*b*. The light, which comes from the fifth partial area of the spatial light modulator 2, passes through the ½ wavelength plate 52*e* and the fifth partial area of the spatial light modulator 4, and the light is guided to circular arc-shaped pupil areas R45*a* and R45*b* on the illumination pupil plane, the pupil area R45*a* being disposed between the pupil areas R42*a* and R43*a*, the pupil area R45*b* being disposed between the pupil areas R42*b* and R43*b*, to form substantial surface light sources P45*a*, P45*b*.

The light, which comes from the sixth partial area of the spatial light modulator 2, passes through the ½ wavelength plate 52*f* and the sixth partial area of the spatial light modulator 4, and the light is guided to circular arc-shaped pupil areas R46*a* and R46*b* on the illumination pupil plane, the pupil area R46*a* being disposed between the pupil areas R41*b* and R43*a*, the pupil area R46*b* being disposed between the pupil areas R41*a* and R43*b*, to form substantial surface light sources P46*a*, P46*b*. The light, which comes from the seventh partial area of the spatial light modulator 2, passes through the ½ wavelength plate 52*g* and the seventh partial area of the spatial light modulator 4, and the light is guided to circular arc-shaped pupil areas R47a and R47b on the illumination pupil plane, the pupil area R47a being disposed between the pupil areas R42a and R44a, the pupil area R47b being disposed between the pupil areas R42b and R44b, to form substantial surface light sources P47a, P47b.

The light, which comes from the eighth partial area of the spatial light modulator 2, passes through the ½ wavelength plate 52h and the eighth partial area of the spatial light modulator 4, and the light is guided to circular arc-shaped pupil areas R48a and R48b on the illumination pupil plane, the pupil area R48a being disposed between the pupil areas R41a and R44a, the pupil area R48b being disposed between the pupil areas R41b and R44b, to form substantial surface light sources P48a, P48b. Thus, the annular pupil intensity distribution 24 of sixteen division type, which is in the circumferential direction polarization state, is formed.

In the modified embodiment based on the use of the polarizing member 5A, the sixteen pole-shaped pupil intensity distribution in the circumferential direction polarization state can be formed on the illumination pupil defined just downstream from the micro fly's-eye lens 8 by merely controlling the spatial light modulator 4. Further, the annular pupil intensity distribution in the radial direction polarization state and the sixteen pole-shaped pupil intensity distribution in the radial direction polarization state can be formed on the illumination pupil defined just downstream from the micro fly's-eye lens 8 by controlling the spatial light modulator 2.

Specifically, when the pupil intensity distribution in the radial direction polarization state is formed, then the light allowed to come from the first partial area of the spatial light modulator 2 is guided to the ½ wavelength plate 52b, the light allowed to come from the second partial area is guided to the ½ wavelength plate 52a, the light allowed to come from the third partial area is guided to the ½ wavelength plate 52d, and the light allowed to come from the fourth partial area is guided to the ½ wavelength plate 52c. Similarly, the light allowed to come from the fifth partial area of the spatial light modulator 2 is guided to the ½ wavelength plate 52h, the light allowed to come from the sixth partial area is guided to the ½ wavelength plate 52g, the light allowed to come from the seventh partial area is guided to the ½ wavelength plate 52f, and the light allowed to come from the eighth partial area is guided to the ½ wavelength plate 52e.

In the modified embodiment based on the use of the polarizing member 5A, the center pole surface light source, which is substantially in the non-polarization state, can be also added to the annular or sixteen pole-shaped pupil intensity distribution controlling the spatial light modulators 2, 4. When the center pole surface light source is formed, parts of the light allowed to come from the first to eighth partial areas of the spatial light modulator 4 are superimposed (overlaid) in the center pupil area including the optical axis AX on the illumination pupil defined just downstream from the micro fly's-eye lens 8. As a result, the center pole surface light source is in the substantial non-polarization state including various linear polarization components.

In the case of the polarizing member 5A, the relatively large size of incident area is given to each of the ½ wavelength plates 52a, 52b for generating the longitudinal polarization and the lateral polarization, the wavelength plates 52a and 52b having the relatively high frequency of use, the average size of incident area is given to each of the ½ wavelength plates 52c, 52d for generating the 45 degrees oblique polarization, the wavelength plates 52c and 52d having the average frequency of use, and the relatively small size of incident area is given to each of the other ½ wavelength plates 52e to 52h having the relatively low frequency of use. As a result, in the case of the polarizing member 5A, it is possible to suppress the occurrence of any local damage which would be otherwise caused by the radiation of light. Consequently, it is possible to improve the durability of the polarizing member 5A.

Figure 13:
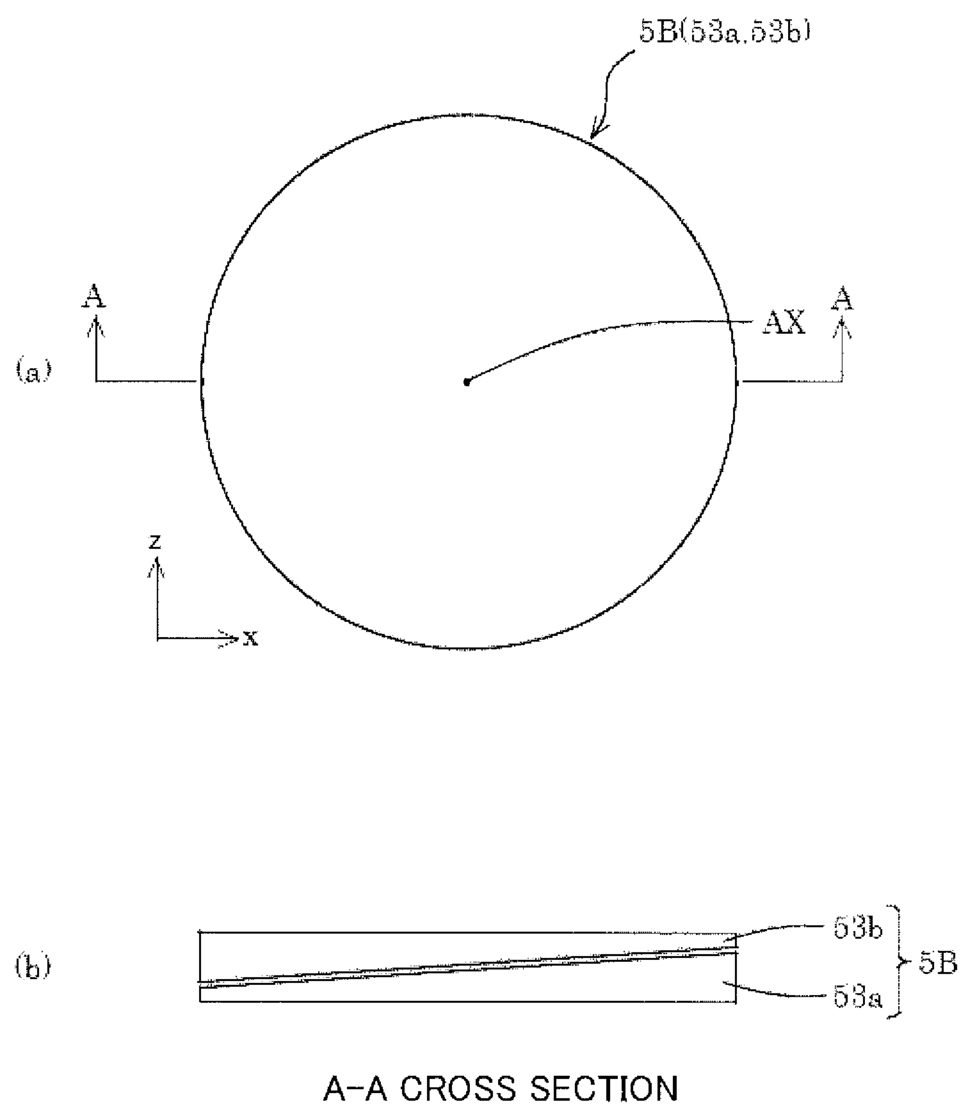
FIG. 13 schematically shows a construction of a polarizing member according to a second modified embodiment.

In another exemplary case, as shown in FIG. 13, it is also possible to construct a polarizing member 5B, for example, by using a wavelength plate 53a which has such a wedge-shaped form that the thickness is changed continuously (linearly, in a curved form, or in a stepped form) in the x direction, and a correcting plate 53b which has a wedge-shaped form complementary to the wavelength plate 53a and which is provided to compensate the light polarizing action effected by the wavelength plate 53a. In a modified embodiment based on the use of the polarizing member 5B shown in FIG. 13, for example, the polarization state of each pupil area in the annular or multi-pole-shaped pupil intensity distribution can be set to a desired linear polarization state, a desired elliptical polarization state (including a circular polarization state), or a substantial non-polarization state.

Figure 14:
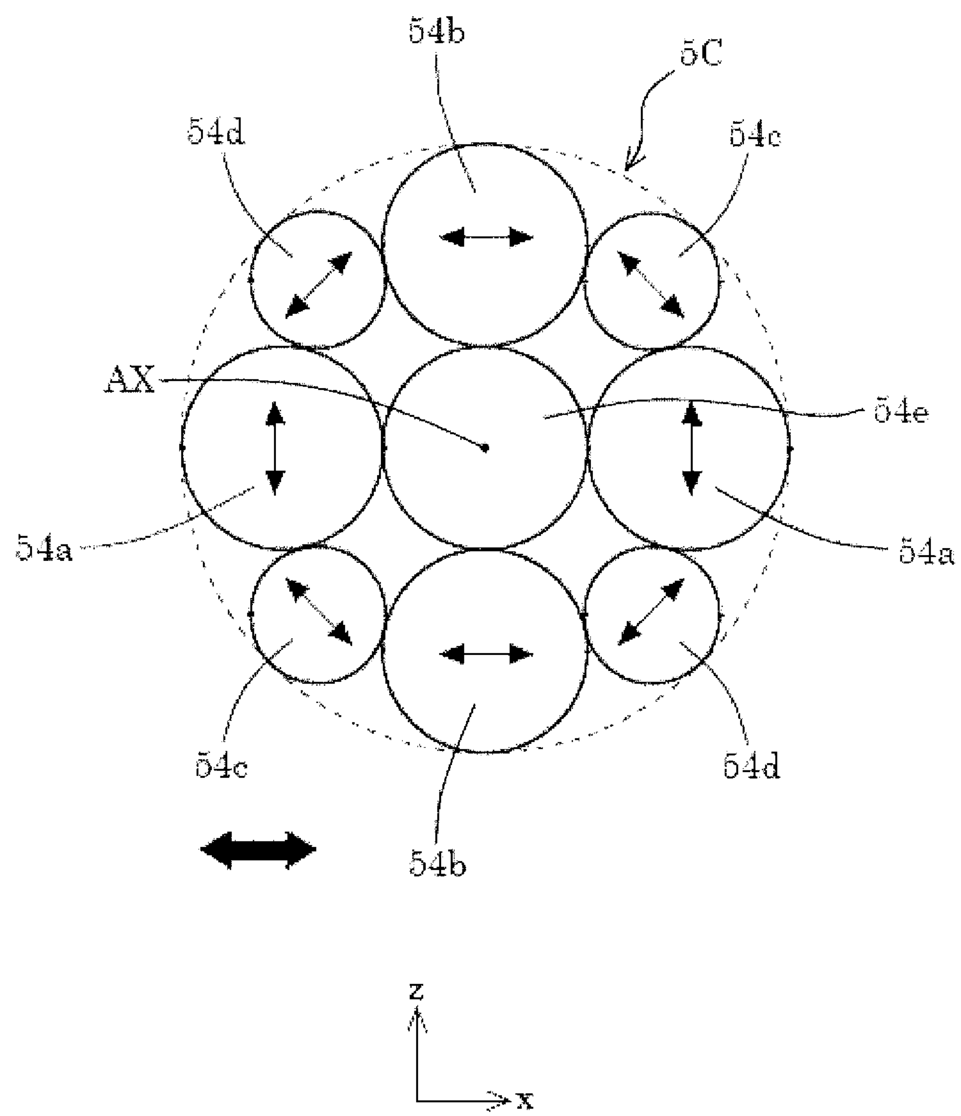
FIG. 14 schematically shows a construction of a polarizing member according to a third modified embodiment.

In the embodiment shown in FIG. 5, the modified embodiment shown in FIG. 11, and the modified embodiment shown in FIG. 13, the polarizing members 5, 5A, 5B are constructed by using the wavelength plates. However, the polarizing member can be also constructed by using, for example, optical rotation elements (optically active elements) without being limited to the wavelength plates. For example, as shown in FIG. 14, a polarizing member 5C, which has the same function as that of the polarizing member 5 according to the embodiment shown in FIG. 5, can be constructed by eight optical rotation elements 54a, 54b, 54c, 54d and one depolarizer 54e.

Each of the optical rotation elements 54a to 54d has a form of parallel flat plate (plane-parallel plate), and is formed of a crystal material which is an optical material having the optical rotation property, for example, quartz crystal. The incident surface (incoming surface) (as well as the outgoing surface) of each of the optical rotation elements 54a to 54d is perpendicular to the optical axis AX, and the crystal optic axis thereof is approximately coincident with the direction of the optical axis AX (i.e., approximately coincident with the traveling direction of the incident light). The optical rotation elements 54a to 54d have mutually different thicknesses, and consequently have mutually different polarization conversion characteristics. Specifically, the optical rotation elements 54a to 54d have the same polarization conversion characteristics as those of the ½ wavelength plates 51a to 51d of the polarizing member 5 shown in FIG. 5, respectively.

That is, as for the optical rotation element 54a, the thickness in the optical axis direction is set so that the light of z direction linear polarization is allowed to outgo when the light of x direction linear polarization comes thereinto. As for the optical rotation element 54b, the thickness is set so that the light of x direction linear polarization is allowed to outgo without undergoing any change in the polarization direction when the light of x direction linear polarization comes thereinto. As for the optical rotation element 54c, the thickness is set so that the light of +45 degrees oblique direction linear polarization is allowed to outgo when the light of x direction linear polarization comes thereinto. As for the optical rotation element 54d, the thickness is set so that the light of −45 degrees oblique direction linear polarization is allowed to outgo when the light of x direction linear polarization comes thereinto.

Figure 15:
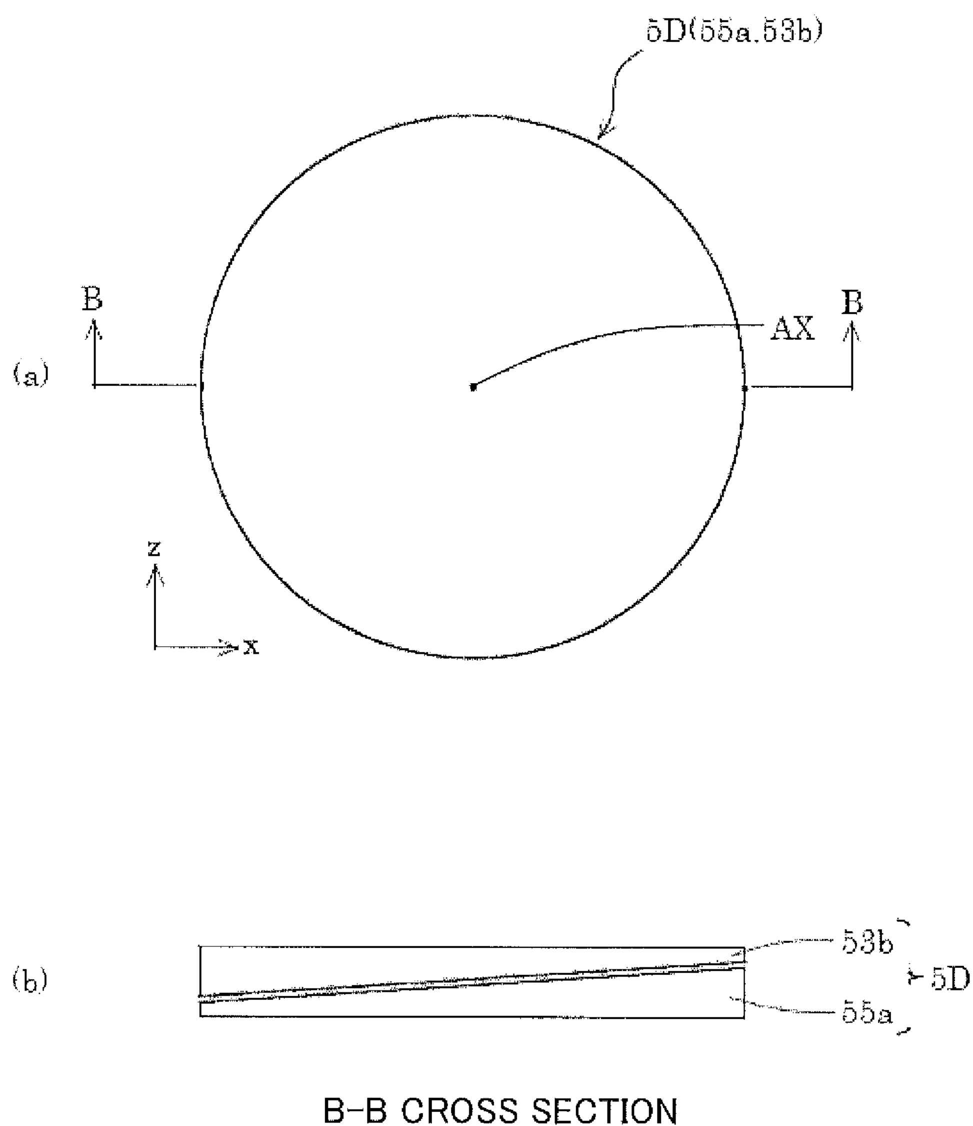
FIG. 15 schematically shows a construction of a polarizing member according to a fourth modified embodiment.

Similarly, although not shown in the drawings, a polarizing member, which has the same function as that of the polarizing member 5A according to the modified embodiment shown in FIG. 11, can be constructed by using eight optical rotation elements having mutually different polarization conversion characteristics. Further, as shown in FIG. 15, a polarizing member 5D can be constructed by replacing the wavelength plate 53*a* of the polarizing member 5B shown in FIG. 13, for example, with an optical rotation element 55*a* having the same form. In the modified embodiment based on the use of the polarizing member 5D shown in FIG. 15, for example, the polarization state of each pupil area in the annular or multi-pole-shaped pupil intensity distribution can be set to a desired linear polarization state or a substantial non-polarization state.

In general, it is important for the polarizing member to give a change of a polarization state to a first light beam allowed to pass through a first area in a plane intersecting the optical axis of the illumination optical system, the change of the polarization state being different from that of a second light beam allowed to pass through a second area different from the first area. Therefore, in the polarizing member, a plurality of wedge-shaped wavelength plates having mutually different polarization conversion characteristics may be arranged in a parallel manner in the optical path, or a plurality of wedge-shaped optical rotation elements having mutually different polarization conversion characteristics may be arranged in a parallel manner in the optical path polarizing member may be constructed by allowing wavelength plates and optical rotation elements to exist in a mixed manner. A plurality of types of polarizing members selected from various types of polarizing members as described above may be arranged in a serial manner along the optical path. Respective polarizing members may be arranged in a fixed manner in the optical path, respective polarizing members may be constructed movably or rotatably, or respective polarizing members may be constructed exchangeably.

In the foregoing explanation, the arrangement plane of the spatial light modulator 4 for pupil formation is arranged at the position optically conjugate with the arrangement plane of the spatial light modulator 2 for polarization sorting or in the vicinity thereof. The polarizing member 5 is arranged at the pupil position of the re-imaging optical system 3 or in the vicinity thereof, i.e., the position in an optical Fourier transform relation with the arrangement plane of the spatial light modulator 2 for polarization sorting or in the vicinity thereof. However, there is no limitation thereto. The arrangement plane of the spatial light modulator for pupil formation can be arranged in the space optically conjugate with the arrangement plane of the spatial light modulator for polarization sorting or in the space in an optical Fourier transform relation with the arrangement plane of the spatial light modulator for polarization sorting. The polarizing member can be arranged in the pupil space of the re-imaging optical system. The polarizing member can be arranged in the space in an optical Fourier transform relation with the arrangement plane of the spatial light modulator for polarization sorting.

The "space optically conjugate" with the arrangement plane of the spatial light modulator for polarization sorting is the space defined between the optical element having the power and arranged adjacently on the front side of the conjugate position optically conjugate with the arrangement plane of the spatial light modulator for polarization sorting and the optical element having the power and arranged adjacently on the back side of the conjugate position concerned. The "pupil space" of the re-imaging optical system is the space defined between the optical element having the power and arranged adjacently on the front side of the pupil position of the re-imaging optical system and the optical element having the power and arranged adjacently on the back side of the pupil position concerned.

The "space in an optical Fourier transform relation" with the arrangement plane of the spatial light modulator for polarization sorting is the space defined between the optical element having the power and arranged adjacently on the front side of the Fourier transform plane in an optical Fourier transform relation with the arrangement plane of the spatial light modulator for polarization sorting and the optical element having the power and arranged adjacently on the back side of the Fourier transform plane concerned. Any parallel flat plate (plane-parallel plate) and/or any plane mirror having no power may exist in the "optically conjugate space", the "pupil space", and the "space in an optical Fourier transform relation".

Therefore, various modified embodiments are available in relation to the arrangement relationship among the spatial light modulator for polarization sorting, the polarizing member, and the spatial light modulator for pupil formation. For example, it is also possible to adopt such a construction that the polarizing member and the spatial light modulator for pupil formation are arranged in the space in an optical Fourier transform relation with the arrangement plane of the spatial light modulator for polarization sorting and defined on the illumination objective surface side with respect to the spatial light modulator for polarization sorting.

Figure 16:
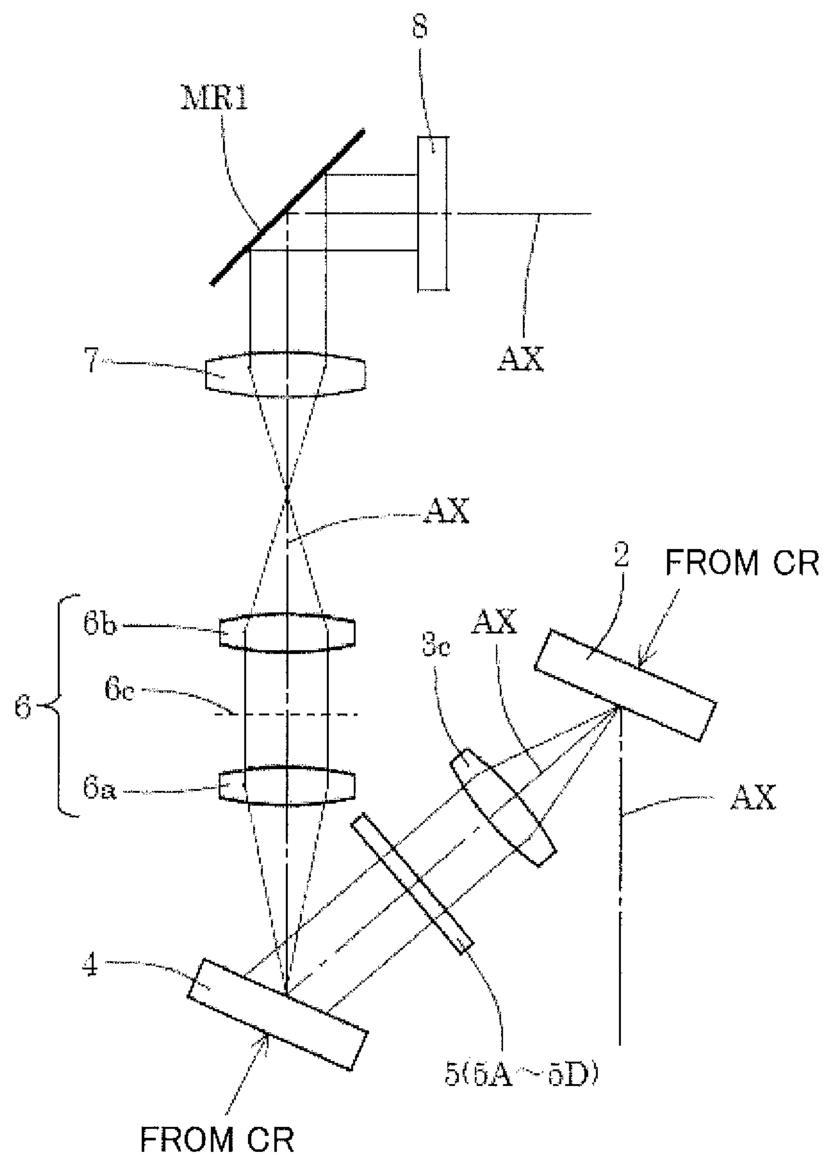
FIG. 16 shows a first modified embodiment concerning the arrangement relationship between a spatial light modulator for polarization sorting, a polarizing member, and a spatial light modulator for pupil formation.

Specifically, in a modified embodiment shown in FIG. 16, a relay optical system 3*c*, which forms the position in an optical Fourier transform relation with the arrangement plane of the spatial light modulator 2, is arranged in the optical path defined on the mask side (the illumination objective surface side) with respect to the spatial light modulator 2 for polarization sorting. The polarizing member 5 (5A to 5D) is arranged in the optical path between the relay optical system 3*c* and the spatial light modulator 4 for pupil formation. The arrangement plane of the spatial light modulator 4 is set at the position in an optical Fourier transform relation with the arrangement plane of the spatial light modulator 2 formed by the relay optical system 3*c* or in the vicinity thereof.

FIG. 16 shows the optical path ranging from the spatial light modulator 2 for polarization sorting to the micro fly's-eye lens 8, and the construction other than that is the same as that shown in FIG. 1. In another expression, only the construction, which is provided between the spatial light modulators 2 and 4 shown in FIG. 16, is different from the construction shown in FIG. 1. Also in the construction shown in FIG. 16, the relay optical systems 6, 7 constitute the distribution forming optical system which images the far field pattern, which is formed by the plurality of mirror elements 4*a* of the spatial light modulator 4 in the far field, onto the position conjugate with the illumination pupil defined just downstream from the micro fly's-eye lens 8 (incident surface of the micro fly's-eye lens 8 or in the vicinity thereof), in the same manner as the construction shown in FIG. 1.

In the modified embodiment shown in FIG. 16, the relay optical system 3*c* converts the angles given to the outgoing light by the plurality of mirror elements 2*a* of the spatial light modulator 2 into the positions on the incident surface of the polarizing member 5 (5A to 5D) which is the far field of the spatial light modulator 2 and the positions on the arrangement plane of the spatial light modulator 4 (incident surfaces of the plurality of mirror elements 4*a*). As a result, also in the modified embodiment shown in FIG. 16, it is possible to form the pupil intensity distribution having the desired shape and the polarization state by the collaboration among the spatial light modulator 2 for polarization sorting, the polarizing member 5 (5A to 5D), and the spatial light modulator 4 for pupil formation.

In another exemplary case, it is also possible to adopt such a construction that the spatial light modulator for pupil formation is arranged in the space in an optical Fourier transform relation with the arrangement plane of the spatial light modulator for polarization sorting on the light source side with respect to the spatial light modulator for polarization sorting, and the polarizing member is arranged in the space in an optical Fourier transform relation with the arrangement plane of the spatial light modulator for polarization sorting on the illumination objective surface side with respect to the spatial light modulator for polarization sorting.

Figure 17:
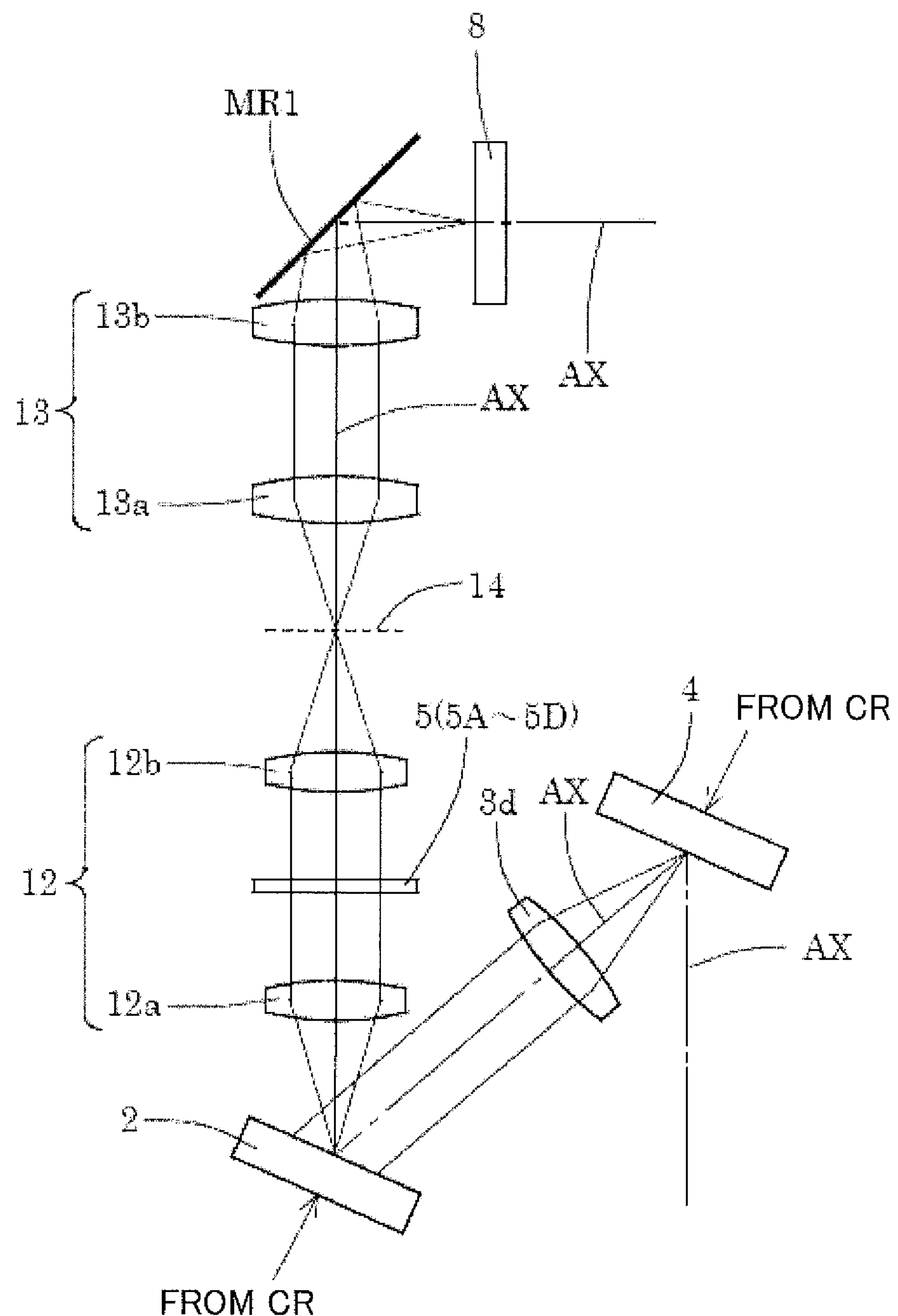
FIG. 17 shows a second modified embodiment concerning the arrangement relationship between a spatial light modulator for polarization sorting, a polarizing member, and a spatial light modulator for pupil formation.
Figure 17:
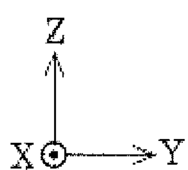

Specifically, in a modified embodiment shown in FIG. 17, a relay optical system 3*d*, which forms the position in an optical Fourier transform relation with the arrangement plane of the spatial light modulator 4, is arranged in the optical path on the mask side (the illumination objective surface side) with respect to the spatial light modulator 4 for pupil formation. The arrangement plane of the spatial light modulator 2 for polarization sorting is set at the position in an optical Fourier transform relation with the arrangement plane of the spatial light modulator 4 formed by the relay optical system 3*d* or in the vicinity thereof. A pair of imaging optical systems 12, 13 are arranged in the optical path defined between the spatial light Modulator 2 and the micro fly's-eye lens 8.

The first imaging optical system 12 is composed of a front side lens group 12*a* and a back side lens group 12*b*, and the first imaging optical system 12 forms the plane 14 optically conjugate with the arrangement plane of the spatial light modulator 2. The second imaging optical system 13 is composed of a front side lens group 13*a* and a back side lens group 13*b*, and the second imaging optical system 13 forms the plane optically conjugate with the conjugate plane 14 on the incident surface of the micro fly's-eye lens 8 or in the vicinity thereof. The polarizing member 5 (5A to 5D) is arranged in the pupil space of the first imaging optical system 12, for example, at the pupil position between the front side lens group 12*a* and the back side lens group 12*b* or in the vicinity thereof.

FIG. 17 shows the optical path ranging from the spatial light modulator 4 for pupil formation to the micro fly's-eye lens 8, and the construction other than that is the same as that shown in FIG. 1. In view of the relationship with the micro fly's-eye lens 8, the back side lens group 13*b* of the second imaging optical system 13 shown in FIG. 17 corresponds to the relay optical system 7 shown in FIG. 1, the front side lens group 13*a* of the second imaging optical system 13 and the back side lens group 12*b* of the first imaging optical system 12 shown in FIG. 17 correspond to the back side lens group 6*b* and the front side lens group 6*a* of the relay optical system 6 shown in FIG. 1, and the pupil plane 6*c* shown in FIG. 1 corresponds to the conjugate plane 14.

In the construction shown in FIG. 17, the relay optical system 3*d*, the first imaging optical system 12, and the second imaging optical system 13 constitute the distribution forming optical system which images the far field pattern, which is formed in the far field of the spatial light modulator 4 by the plurality of mirror elements 4*a* of the spatial light modulator 4, onto the position conjugate with the illumination pupil defined just downstream from the micro fly's-eye lens 8 (incident surface of the micro fly's-eye lens 8 or in the vicinity thereof).

In the modified embodiment shown in FIG. 17, the front side lens group 12*a* of the first imaging optical system 12 converts the angles given to the outgoing light by the plurality of mirror elements 2*a* of the spatial light modulator 2 into the positions on the incident surface of the polarizing member 5 (5A to 5D) which is the far field of the spatial light modulator 2. Further, the relay optical system 3*d* converts the angles given to the outgoing light by the plurality of mirror elements 4*a* of the spatial light modulator 4 into the positions on the arrangement plane of the spatial light modulator 2 (incident surfaces of the plurality of mirror elements 2) which is the far field of the spatial light modulator 4. As a result, also in the modified embodiment shown in FIG. 17, it is possible to form the pupil intensity distribution having the desired shape and the polarization state by the collaboration among the spatial light modulator 2 for polarization sorting, the polarizing member 5 (5A to 5D), and the spatial light modulator 4 for pupil formation.

In the embodiment described above, the spatial light modulator, in which the directions (angles, inclinations) of the plurality of reflecting surfaces arranged two-dimensionally can be individually controlled, is used as the spatial light modulators 2, 4 having the plurality of mirror elements arranged two-dimensionally and controlled individually. However, there is no limitation thereto. For example, it is also possible to use a spatial light modulator in which the heights (positions) of a plurality of reflecting surfaces arranged two-dimensionally can be individually controlled. As for the spatial light modulator as described above, it is possible to use, for example, spatial light modulators disclosed in U.S. Pat. No. 5,312,513 and FIG. 1d of U.S. Pat. No. 6,885,493. In the case of those spatial light modulators, the action or function, which is the same as or equivalent to that of the diffraction surface, can be given to the incident light by forming the two-dimensional height distribution. The spatial light modulator described above, which has the plurality of reflecting surfaces arranged two-dimensionally, may be modified in accordance with the disclosure of, for example, U.S. Pat. No. 6,891,655 and United States Patent Application Publication No. 2005/0095749.

In the embodiment described above, the spatial light modulators 2, 4 are provided with the plurality of mirror elements 2*a*, 4*a* arranged two-dimensionally in the predetermined plane. However, there is no limitation thereto. It is also possible to use a transmission type spatial light modulator provided with a plurality of transmission optical elements arranged in a predetermined plane and controlled individually.

In the embodiment described above, one spatial light modulator is used as the spatial light modulator for pupil formation. However, it is also possible to use a plurality of spatial light modulators for pupil formation. As for the illumination optical system directed to the exposure apparatus using the plurality of spatial light modulators for pupil formation, it is possible to adopt illumination optical systems disclosed, for example, in United States Patent Application Publication No. 2009/0109417 and United States Patent Application Publication No. 2009/0128886.

In the embodiment described above, a variable pattern forming apparatus, which forms a predetermined pattern on the basis of predetermined electronic data, can be used in place of the mask. As for the variable pattern forming apparatus, for example, it is possible to use a spatial light modulating element including a plurality of reflecting elements driven on the basis of predetermined electronic data. An exposure apparatus, which uses the spatial light modulating element, is disclosed, for example, in United States Patent Application Publication No. 2007/0296936. Other than the reflection type spatial light modulator of the non-light emission type as described above, it is also allowable to use a transmission type spatial light modulator, and it is also allowable to use an image display element of the self-light emission type.

The exposure apparatus of the embodiment described above is produced by assembling the various subsystems including the respective constitutive elements as recited in claims of this application so that the predetermined mechanical accuracy, the electrical accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electrical accuracy for the various electrical systems. The steps of assembling the various subsystems into the exposure apparatus include, for example, the mechanical connection, the wiring connection of the electric circuits, and the piping connection of the air pressure circuits among the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies of the entire exposure apparatus. It is also appropriate that the exposure apparatus is produced in a clean room in which, for example, the temperature and the cleanness are managed.

Figure 18:
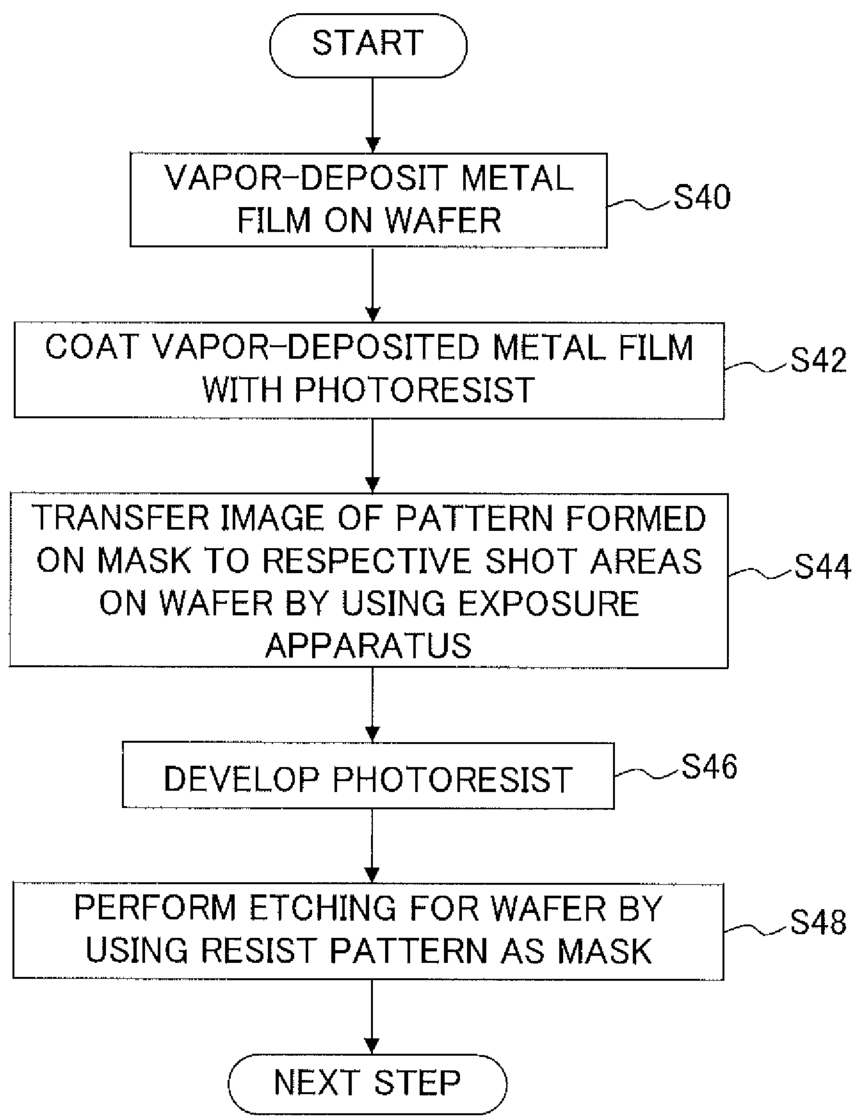
FIG. 18 shows a flow chart illustrating steps of producing a semiconductor device.

Next, an explanation will be made about a method for producing the device by using the exposure apparatus according to the embodiment described above. FIG. 18 shows a flow chart illustrating steps of producing a semiconductor device. As shown in FIG. 18, in the steps of producing the semiconductor device, a metal film is vapor-deposited on the wafer W as the substrate for the semiconductor device (Step S40), and the vapor-deposited metal film is coated with a photoresist which is a photosensitive material (Step S42). Subsequently, a pattern formed on the mask (reticle) M is transferred to respective shot areas on the wafer W by using the projection exposure apparatus of the embodiment described above (Step S44: exposure step). The development of the wafer W for which the transfer is completed, i.e., the development of the photoresist to which the pattern has been transferred is performed (Step S46: development step).

After that, the processing such as the etching or the like is performed for the surface of the wafer W by using the resist pattern generated on the surface of the wafer W in Step S46 as a mask (Step S48: processing step). In this context, the resist pattern is the photoresist layer in which protrusions and recesses having the shapes corresponding to the pattern transferred by the projection exposure apparatus of the embodiment described above are generated, wherein the recesses penetrate through the photoresist layer. In Step S48, the processing is performed for the surface of the wafer W via the resist pattern. The processing, which is performed in Step S48, includes, for example, at least one of the etching of the surface of the wafer W and the film formation of the metal film or the like. In Step S44, the projection exposure apparatus of the embodiment described above performs the transfer of the pattern by using the wafer W coated with the photoresist as the photosensitive substrate.

Figure 19:
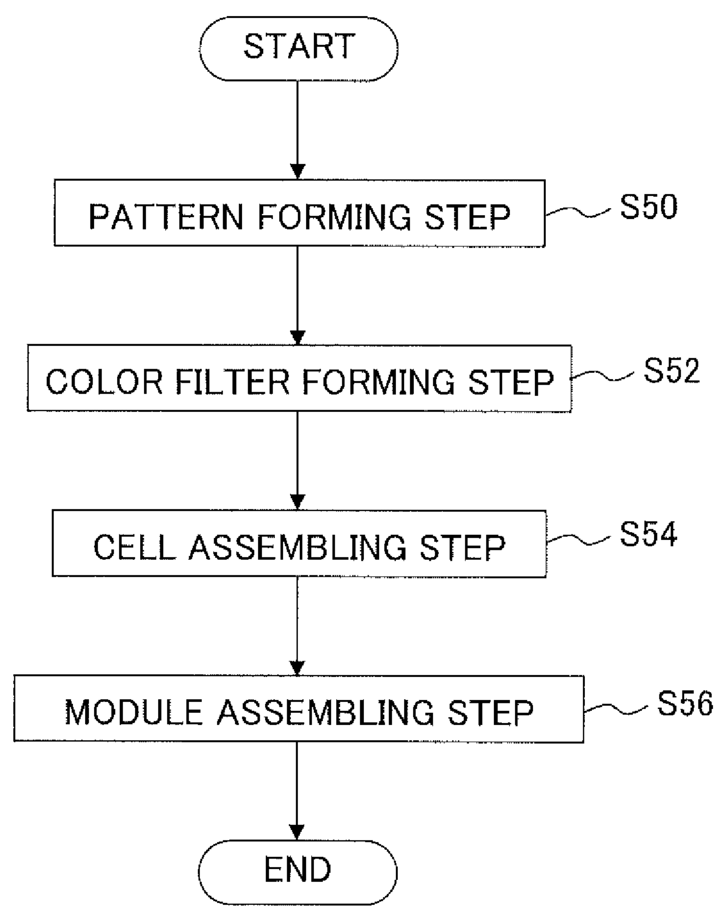

FIG. 19 shows a flow chart illustrating steps of producing a liquid crystal device such as a liquid crystal display element or the like. As shown in FIG. 19, in the steps of producing the liquid crystal device, a pattern forming step (Step S50), a color filter forming step (Step S52), a cell assembling step (Step S54), and a module assembling step (Step S56) are successively performed. In the pattern forming step of Step S50, a predetermined pattern such as a circuit pattern, an electrode pattern or the like is formed on a plate P which is a glass substrate coated with a photoresist by using the projection exposure apparatus of the embodiment described above. The pattern forming step includes an exposure step of transferring the pattern to the photoresist layer by using the projection exposure apparatus of the embodiment described above, a development step of performing the development of the plate P to which the pattern is transferred, i.e., the development of the photoresist layer on the glass substrate to generate the photoresist layer having a shape corresponding to the pattern, and a processing step of processing the surface of the glass substrate via the developed photoresist layer.

In the color filter forming step of Step S52, a color filter is formed, in which a large number of dot sets each composed of three dots corresponding to R (Red), G (Green), and B (Blue) are arranged in a matrix form, or a plurality of filter sets each composed of three stripes of R, G, and B are arranged in the horizontal scanning direction. In the cell assembling step of Step S54, a liquid crystal panel (liquid crystal cell) is assembled by using the glass substrate on which the predetermined pattern is formed in Step S50 and the color filter which is formed in Step S52. Specifically, for example, a liquid crystal panel is formed by injecting the liquid crystal into the space between the glass substrate and the color filter. In the module assembling step of Step S56, various parts including, for example, an electric circuit and a backlight, which are provided to allow the liquid crystal panel to perform the displaying operation, are attached to the liquid crystal panel which is assembled in Step S54.

The present teaching is not limited to the application to the exposure apparatus for producing the semiconductor device. The present teaching is also widely applicable, for example, to the exposure apparatus for producing the liquid crystal display device to be formed on the rectangular glass plate or the display apparatus such as the plasma display or the like as well as the exposure apparatus for producing various devices including, for example, the image pickup device (for example, CCD), the micromachine, the thin film magnetic head, and the DNA chip. Further, the present teaching is also applicable to the exposure step (exposure apparatus) to be used when the mask (for example, the photomask and the reticle) formed with the mask pattern for various devices is produced by using the photolithography step.

In the embodiment described above, the ArF excimer laser light (wavelength: 193 nm) and the KrF excimer laser light (wavelength: 248 nm) are used as the exposure light. However, there is no limitation thereto. The present teaching is also applicable to any other appropriate laser light source including, for example, the $F_2$ laser light source for supplying the laser beam having a wavelength of 157 nm, the pulse laser light source such as the $Ar_2$ laser (output wavelength: 126 nm), the $Kr_2$ laser (output wavelength: 146 nm) and the like, the g-ray (wavelength: 436 nm), harmonic generator for the YAG laser, and the ultra-high pressure mercury lamp for generating the emission line such as the i-ray (wavelength: 365 nm) or the like.

For example, as disclosed in U.S. Pat. No. 7,023,610, it is also appropriate to use the harmonic wave as the vacuum ultraviolet light, the harmonic wave being obtained by amplifying the single wavelength laser beam which is in the infrared region or the visible region and which is oscillated from the fiber laser or the DFB semiconductor laser with, for example, a fiber amplifier doped with erbium (or both of erbium and ytterbium) and performing the wavelength conversion to convert the amplified laser beam into the ultraviolet light by using the nonlinear optical crystal.

In the embodiment described above, it is also appropriate to apply a technique in which the inside of the optical path defined between the projection optical system and the photosensitive substrate is filled with a medium (typically a liquid) having a refractive index larger than 1.1, i.e., the so-called liquid immersion method. In this case, those adoptable as the technique for filling the inside of the optical path defined between the projection optical system and the photosensitive substrate with the liquid include, for example, a technique in which the optical path is locally filled with the liquid such as the technique disclosed in International Publication No. WO99/49504, a technique in which a stage which holds a substrate as an exposure objective is moved in a liquid bath such as the technique disclosed in Japanese Patent Application Laid-open No. 6-124873, and a technique in which a liquid pool having a predetermined depth is formed on a stage and a substrate is held therein such as the technique disclosed in Japanese Patent Application Laid-open No. 10-303114. Without being limited to the above, it is also possible to apply techniques disclosed, for example, in European Patent Application Publication No. 1420298, International Publication No. 2004/055803, and U.S. Pat. No. 6,952,253. Teachings of International Publication No. WO99/49504, Japanese Patent Application Laid-open No. 6-124873, Japanese Patent Application Laid-open No. 10-303114, European Patent Application Publication No. 1420298, International Publication No. 2004/055803, and U.S. Pat. No. 6,952,253 are incorporated herein by reference.

In the embodiment described above, the projection optical system of the exposure apparatus is not limited to the reduction system, which may be any one of the 1× magnification system and the enlarging (magnifying) system. The projection optical system is not limited to the refractive system, which may be any one of the reflection system and the cata-dioptric system. The projected image may be any one of the inverted image and the erected image.

For example, as disclosed in International Publication No. 2001/035168, the present teaching is applicable to an exposure apparatus (lithography system) in which a line-and-space pattern is formed on a wafer W by forming interference fringes on the wafer W.

Further, for example, as disclosed in U.S. Pat. No. 6,611,316, the present teaching is applicable to an exposure apparatus in which two reticle patterns are combined (synthesized) on a wafer via a projection optical system, and one shot area on the wafer is subjected to the double exposure substantially simultaneously by means of one time of the scanning exposure.

In the embodiment described above, the object on which the pattern is to be formed (object as the exposure objective to be irradiated with the energy beam), is not limited to the wafer. The object may be any other object including, for example, glass plates, ceramic substrates, film members, and mask blanks.

In the embodiment described above, the present teaching is applied to the illumination optical system for illuminating the mask (or the wafer) in the exposure apparatus. However, there is no limitation thereto. The present teaching is also applicable to any general illumination optical system for illuminating any illumination objective surface other than the mask (or the wafer).

While the particular aspects of embodiment(s) of the ILLUMINATION OPTICAL ASSEMBLY, EXPOSURE DEVICE, AND DEVICE MANUFACTURE METHOD described and illustrated in this patent application in the detail required to satisfy 35 U.S.C. § 112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the subject matter claimed are merely exemplary, illustrative and representative of the subject matter which is broadly contemplated by the claimed subject matter. The scope of the presently described and claimed aspects of embodiments fully encompasses other embodiments which may now be or may become obvious to those skilled in the art based on the teachings of the Specification. The scope of the present ILLUMINATION OPTICAL ASSEMBLY, EXPOSURE DEVICE, AND DEVICE MANUFACTURE METHOD is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the Specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. § 112, sixth paragraph, unless the element is expressly recited using the phrase "means for" or, in the case of a method claim, the element is recited as a "step" instead of an "act."

It will be understood also by those skilled in the art that, in fulfillment of the patent statutes of the United States, Applicant(s) has disclosed at least one enabling and working embodiment of each invention recited in any respective claim appended to the Specification in the present application and perhaps in some cases only one. Applicant(s) has used from time to time or throughout the present application definitive verbs (e.g., "is", "are", "does", "has", "includes" or the like) and/or other definitive verbs (e.g., "produces," "causes" "samples," "reads," "signals" or the like) and/or gerunds (e.g., "producing," "using," "taking," "keeping," "making," "determining," "measuring," "calculating" or the like), in defining an aspect/feature/element of, an action of or functionality of, and/or describing any other definition of an aspect/feature/element of an embodiment of the subject matter being disclosed. Wherever any such definitive word or phrase or the like is used to describe an aspect/feature/element of any of the one or more embodiments disclosed herein, i.e., any feature, element, system, sub-system, process or algorithm step, particular material, or the like, it should be read, for purposes of interpreting the scope of the subject matter of what applicant(s) has invented, and claimed, to be preceded by one or more, or all, of the following limiting phrases, "by way of example," "for example," "as an example," "illustratively only," "by way of illustration only," etc., and/or to include any one or more, or all, of the phrases "may be," "can be", "might be," "could be" and the like. All such features, elements, steps, materials and the like should be considered to be described only as a possible aspect of the one or more disclosed embodiments and not as the sole possible implementation of any one or more aspects/features/elements of any embodiments and/or the sole possible embodiment of the subject matter of what is claimed, even if, in fulfillment of the requirements of the patent statutes, Applicant(s) has disclosed only a single enabling example of any such aspect/feature/element of an embodiment or of any embodiment of the subject matter of what is claimed. Unless expressly and specifically so stated in the present application or the prosecution of this application, that Applicant(s) believes that a particular aspect/feature/element of any disclosed embodiment or any particular disclosed embodiment of the subject matter of what is claimed, amounts to the one and only way to implement the subject matter of what is claimed or any aspect/feature/element recited in any such claim, Applicant(s) does not intend that any description of any disclosed aspect/feature/element of any disclosed embodiment of the subject matter of what is claimed in the present patent application or the entire embodiment shall be interpreted to be such one and only way to implement the subject matter of what is claimed or any aspect/feature/element thereof, and to thus limit any claim which is broad enough to cover any such disclosed implementation along with other possible implementations of the subject matter of what is claimed, to such disclosed aspect/feature/element of such disclosed embodiment or such disclosed embodiment. Applicant(s) specifically, expressly and unequivocally intends that any claim that has depending from it a dependent claim with any further detail of any aspect/feature/element, step, or the like of the subject matter of what is claimed recited in the parent claim or claims from which it directly or indirectly depends, shall be interpreted to mean that the recitation in the parent claim(s) was broad enough to cover the further detail in the dependent claim along with other implementations and that the further detail was not the only way to implement the aspect/feature/element claimed in any such parent claim(s), and thus be limited to the further detail of any such aspect/feature/element recited in any such dependent claim to in any way limit the scope of the broader aspect/feature/element of any such parent claim, including by incorporating the further detail of the dependent claim into the parent claim.

The invention claimed is:

1. An illumination optical system for illuminating an illumination objective surface with a light from a light source, the illumination optical system comprising:

a first spatial light modulator having a plurality of optical elements into which the light from the light source comes;

a polarizing member having a first polarizing element into which a first light of a light from the first spatial light modulator comes and a second polarizing element into which a second light of the light from the first spatial light modulator comes, so as to allow the first light traveled via the first polarizing element and travelling through a first position to have a first polarization state and allow the second light traveled via the second polarizing element and travelling through a second position different from the first position to have a second polarization state, the first and second positions being positions on a crossing plane crossing an optical axis of the illumination optical system, the first polarization state being a linear polarization having a polarization direction in a first direction within the crossing plane or a second direction, within the crossing plane, orthogonal to the first direction, and the second polarization state being different from a linear polarization having a polarization direction in the first or second direction; and a second spatial light modulator having a plurality of optical elements into which the first and second lights from the polarizing member come, wherein a size of an incident surface of the first polarizing element is larger than a size of an incident surface of the second polarizing element.

2. The illumination optical system according to claim 1, further comprising a condenser optical system which is arranged between the first spatial light modulator and the polarizing member, and which is configured to condense the light from the first spatial light modulator.

3. The illumination optical system according to claim 1, further comprising a controller configured to control the first spatial light modulator so as to control a position of the first light on the incident surface of the first polarizing element and a position of the second light on the incident surface of the second polarizing element.

4. The illumination optical system according to claim 3, further comprising a distribution forming optical system configured to condense a light from the second spatial light modulator to form a pupil intensity distribution on an illumination pupil plane.

5. The illumination optical system according to claim 1, wherein the polarizing member includes at least one of an optical rotation element and a wavelength plate.

6. An exposure apparatus comprising the illumination optical system as defined in claim 1 for illuminating a pattern, the exposure apparatus being configured to expose the pattern onto a photo-sensitive substrate.

7. A device manufacture method comprising:

exposing the pattern onto the photo-sensitive substrate by using the exposure apparatus as defined in claim 6;

developing the photo-sensitive substrate onto which the pattern has been transferred so as to form a mask layer having a shape corresponding to the pattern on a surface of the photo-sensitive substrate; and processing the surface of the photo-sensitive substrate via the mask layer.

8. An illumination optical system for illuminating an illumination objective surface with a light from a light source, the illumination optical system comprising:

a first spatial light modulator having a plurality of optical elements into which the light from the light source comes;

a second spatial light modulator having a plurality of optical elements into which a light from the first spatial light modulator comes; and a polarizing member having a first polarizing element into which a first light of a light from the second spatial light modulator comes and a second polarizing element into which a second light of the light from the second spatial light modulator comes, so as to allow the first light traveled via the first polarizing element and travelling through a first position to have a first polarization state and allow the second light traveled via the second polarizing element and travelling through a second position different from the first position to have a second polarization state, the first and second positions being positions on a crossing plane which crosses an optical axis of the illumination optical system, the first polarization state being a linear polarization having a polarization direction in a first direction within the crossing plane or a second direction, within the crossing plane, orthogonal to the first direction, and the second polarization state being different from a linear polarization having a polarization direction in the first or second direction, wherein a size of an incident surface of the first polarizing element is larger than a size of an incident surface of the second polarizing element.

9. The illumination optical system according to claim 8, further comprising a condenser optical system which is arranged between the first spatial light modulator and the polarizing member, and which is configured to condense the light from the first spatial light modulator.

10. The illumination optical system according to claim 8, further comprising a controller configured to control the first spatial light modulator so as to control a position of the first light on the incident surface of the first polarizing element and a position of the second light on the incident surface of the second polarizing element.

11. The illumination optical system according to claim 10, further comprising a distribution forming optical system configured to condense a light from the second spatial light modulator to form a pupil intensity distribution on an illumination pupil plane.

12. The illumination optical system according to claim 8, further comprising a controller configured to control the second spatial light modulator so as to control a position of the first light on the incident surface of the first polarizing element and a position of the second light on the incident surface of the second polarizing element.

13. The illumination optical system according to claim 8, wherein the polarizing member includes at least one of an optical rotation element and a wavelength plate.

14. An exposure apparatus comprising the illumination optical system as defined in claim 8 for illuminating a pattern, the exposure apparatus being configured to expose the pattern onto a photo-sensitive substrate.

15. A device manufacture method comprising:

exposing the pattern onto the photo-sensitive substrate by using the exposure apparatus as defined in claim 14;

developing the photo-sensitive substrate onto which the pattern has been transferred so as to form a mask layer having a shape corresponding to the pattern on a surface of the photo-sensitive substrate; and processing the surface of the photo-sensitive substrate via the mask layer.

* * * * *